United States Patent
Finley et al.

(10) Patent No.: US 9,051,211 B2
(45) Date of Patent: Jun. 9, 2015

(54) EFFECTS OF METHODS OF MANUFACTURING SPUTTERING TARGETS ON CHARACTERISTICS OF COATINGS

(75) Inventors: James J. Finley, Pittsburgh, PA (US); Harry Buhay, Pittsburgh, PA (US)

(73) Assignee: PPG industries Ohio, Inc., Cleveland, OH (US)

(*) Notice: Subject to any disclaimer, the term of this patent is extended or adjusted under 35 U.S.C. 154(b) by 1219 days.

(21) Appl. No.: 11/112,535

(22) Filed: Apr. 22, 2005

(65) Prior Publication Data

US 2005/0258030 A1    Nov. 24, 2005

Related U.S. Application Data

(60) Provisional application No. 60/565,552, filed on Apr. 27, 2004.

(51) Int. Cl.
C23C 14/34    (2006.01)
C03C 17/22    (2006.01)
(Continued)

(52) U.S. Cl.
CPC ............... *C03C 17/09* (2013.01); *C03C 17/225* (2013.01); *C03C 17/27* (2013.01); *C03C 17/36* (2013.01); *C03C 17/3644* (2013.01); *C03C 17/3652* (2013.01); *C03C 17/366* (2013.01); *C03C 17/3694* (2013.01); *C03C 2217/23* (2013.01); *C03C 2217/27* (2013.01);
(Continued)

(58) Field of Classification Search
CPC .. C23C 14/081; C23C 14/083; C23C 14/185; C23C 14/3414; C23C 17/09; C23C 17/225; C23C 17/27; C23C 17/36; C23C 17/3644; C23C 17/3652; C23C 17/366; C23C 17/3694; C23C 2217/23; C23C 2217/27; C23C 2217/281; C23C 2217/29; C23C 2217/78; C23C 2217/91; C23C 2218/154; C23C 2218/155; C23C 2218/156; C23C 2218/322; C23C 2218/326; C23C 2218/328
USPC ................ 204/298.23, 298.26, 192.1, 192.12
See application file for complete search history.

(56) References Cited

U.S. PATENT DOCUMENTS 3,660,061 A    5/1972    Donley et al. ............... 65/32
4,055,407 A    10/1977   Heithoff et al. ............ 65/27
(Continued)

FOREIGN PATENT DOCUMENTS

CA    2156571    12/2000
DE    101 20 383 A1    11/2002
(Continued)

OTHER PUBLICATIONS

Machine Translation to Hatakeyama (JP 2000-328240) published on Nov. 28, 2000.*
(Continued)

*Primary Examiner* — John Brayton
(74) *Attorney, Agent, or Firm* — Andrew C. Siminerio

(57) ABSTRACT

Titanium and aluminum cathode targets are disclosed for sputtering absorbing coatings of titanium and aluminum-containing materials in atmospheres comprising inert gas, reactive gases such as nitrogen, oxygen, and mixtures thereof, which can further comprise inert gas, such as argon, to form nitrides, oxides, and oxynitrides, as well as metallic films. The titanium and aluminum-containing coatings can be utilized as an outer coat or as one or more coating layers of a coating stack.

5 Claims, 17 Drawing Sheets

(51) Int. Cl.
*C03C 17/27* (2006.01)
*C03C 17/36* (2006.01)
*C23C 14/06* (2006.01)
*C23C 14/08* (2006.01)
*C23C 14/18* (2006.01)
*C03C 17/09* (2006.01)

(52) U.S. Cl.
CPC ...... *C03C 2217/281* (2013.01); *C03C 2217/29* (2013.01); *C03C 2217/78* (2013.01); *C03C 2217/91* (2013.01); *C03C 2218/154* (2013.01); *C03C 2218/155* (2013.01); *C03C 2218/156* (2013.01); *C03C 2218/322* (2013.01); *C03C 2218/326* (2013.01); *C03C 2218/328* (2013.01); *C23C 14/0641* (2013.01); *C23C 14/0676* (2013.01); *C23C 14/08* (2013.01); *C23C 14/081* (2013.01); *C23C 14/083* (2013.01); *C23C 14/185* (2013.01); *C23C 14/3414* (2013.01)

(56) References Cited

U.S. PATENT DOCUMENTS

| | | | |
|---|---|---|---|
| 4,098,956 A * | 7/1978 | Blickensderfer et al. | 428/627 |
| 4,111,150 A | 9/1978 | Donley et al. | 118/7 |
| 4,320,155 A | 3/1982 | Gillery | 427/160 |
| 4,379,040 A | 4/1983 | Gillery | 204/192 P |
| 4,466,562 A | 8/1984 | DeTorre | 225/2 |
| 4,512,863 A | 4/1985 | Criss et al. | 204/192 R |
| 4,591,544 A * | 5/1986 | Sasa et al. | 430/166 |
| 4,594,137 A | 6/1986 | Gillery et al. | 204/192 SP |
| 4,610,771 A | 9/1986 | Gillery | 204/192.1 |
| 4,671,155 A | 6/1987 | Goldinger | 83/886 |
| 4,716,086 A | 12/1987 | Gillery et al. | 428/630 |
| 4,719,126 A | 1/1988 | Henery | 427/165 |
| 4,719,127 A | 1/1988 | Greenberg | 427/165 |
| 4,746,347 A | 5/1988 | Sensi | 65/94 |
| 4,786,563 A | 11/1988 | Gillery et al. | 428/630 |
| 4,792,536 A | 12/1988 | Pecoraro et al. | 501/70 |
| 4,853,257 A | 8/1989 | Henery | 427/166 |
| 4,861,669 A | 8/1989 | Gillery | 428/434 |
| 4,900,633 A | 2/1990 | Gillery | 428/432 |
| 4,920,006 A | 4/1990 | Gillery | 428/432 |
| 4,938,857 A | 7/1990 | Gillery | 204/192.27 |
| 4,962,612 A * | 10/1990 | Kuwano et al. | 52/506.06 |
| 4,971,843 A | 11/1990 | Michelotti et al. | 428/34 |
| 4,990,234 A | 2/1991 | Szczyrbowski et al. | 204/192.23 |
| 4,992,087 A * | 2/1991 | Holscher | 65/60.2 |
| 5,122,250 A * | 6/1992 | Doormann et al. | 204/192.26 |
| 5,170,291 A | 12/1992 | Szczyrbowski et al. | 359/580 |
| 5,229,358 A * | 7/1993 | Kumar | 505/434 |
| 5,240,886 A | 8/1993 | Gulotta et al. | 501/70 |
| 5,296,302 A | 3/1994 | O"Shaughnessy et al. | 428/472 |
| 5,320,729 A | 6/1994 | Narizuka | 204/298.13 |
| 5,328,768 A | 7/1994 | Goodwin | 428/428 |
| 5,340,454 A * | 8/1994 | Schaefer et al. | 204/192.12 |
| 5,344,718 A | 9/1994 | Hartig et al. | 428/623 |
| 5,356,522 A * | 10/1994 | Lal et al. | 204/192.15 |
| 5,376,455 A | 12/1994 | Hartig et al. | 428/428 |
| 5,385,872 A | 1/1995 | Gulotta | 501/71 |
| 5,393,593 A | 2/1995 | Gulotta et al. | 428/220 |
| 5,417,827 A | 5/1995 | Finley | 204/192.28 |
| 5,425,861 A | 6/1995 | Hartig et al. | 204/192.26 |
| 5,464,657 A | 11/1995 | Athey et al. | 427/255.5 |
| 5,492,750 A | 2/1996 | Shumaker, Jr. et al. | 428/192 |
| 5,532,180 A | 7/1996 | den Boer et al. | 437/40 |
| 5,584,902 A | 12/1996 | Hartig et al. | 65/32.4 |
| 5,599,387 A | 2/1997 | Neuman et al. | 106/287.14 |
| 5,879,519 A * | 3/1999 | Seeser et al. | 204/192.12 |
| 6,027,766 A | 2/2000 | Greenberg et al. | 427/226 |
| 6,328,858 B1 * | 12/2001 | Felsenthal et al. | 204/192.15 |
| 6,495,251 B1 * | 12/2002 | Arbab et al. | 428/336 |
| 6,852,201 B2 * | 2/2005 | Hermeler et al. | 204/192.12 |
| 6,974,629 B1 * | 12/2005 | Krisko et al. | 428/432 |
| 2002/0162737 A1 | 11/2002 | Durs | |
| 2002/0185369 A1 | 12/2002 | Sawamura | |
| 2005/0026002 A1 * | 2/2005 | Hartig | 428/702 |

FOREIGN PATENT DOCUMENTS

| | | | | |
|---|---|---|---|---|
| FR | 2.010.858 | | 2/1970 | |
| JP | 60 002663 | | 1/1985 | |
| JP | 04365858 A | * | 12/1992 | C23C 14/34 |
| JP | 05326445 A | * | 12/1993 | |
| JP | 2000328240 A | * | 11/2000 | |
| WO | WO 95/29883 | | 11/1995 | |

OTHER PUBLICATIONS

Chemical Characteristics of Float Glass Surfaces, Seiger, J., Journal of Non-Crystalline Solids, vol. 19, pp. 213-220 (1975).
Penetration of Tin in the Bottom Surface of Float Glass: A Synthesis, Columbin L. et al., Journal of Non-Crystalline Solids, vol. 38 & 39, pp. 551-556 (1980).
Tin Oxidation State, Depth Profiles of S-i 2+- and SnA-+ and oxygen Diffusivity in Float Glass by Mössbauer Spectroscop, Williams, K. F. E. et al., Journal of Non-Crystalline Solids, vol. 211, pp. 164-172 (1997).

* cited by examiner

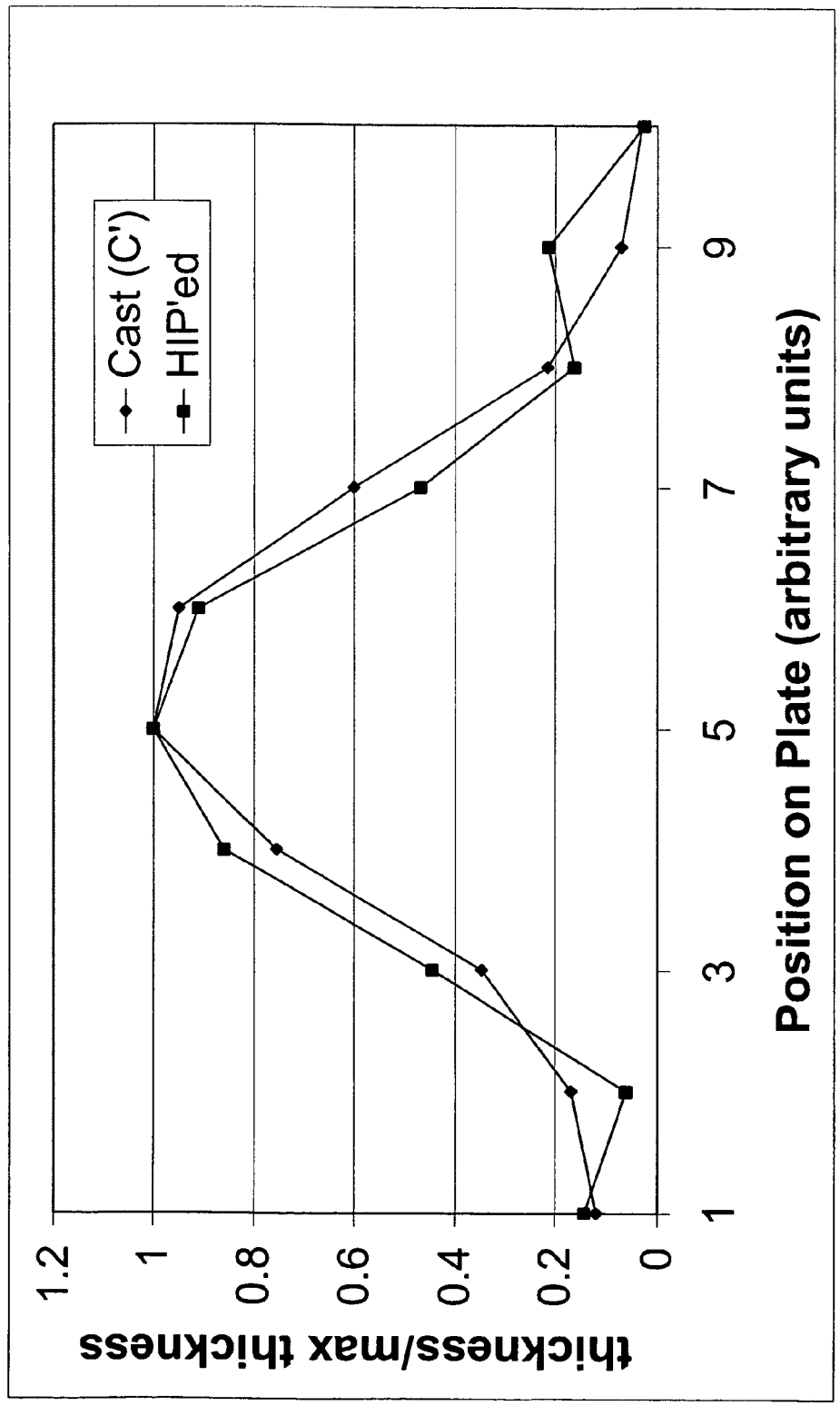
Fig 21 – Normalized Thickness on Stationary Substrate

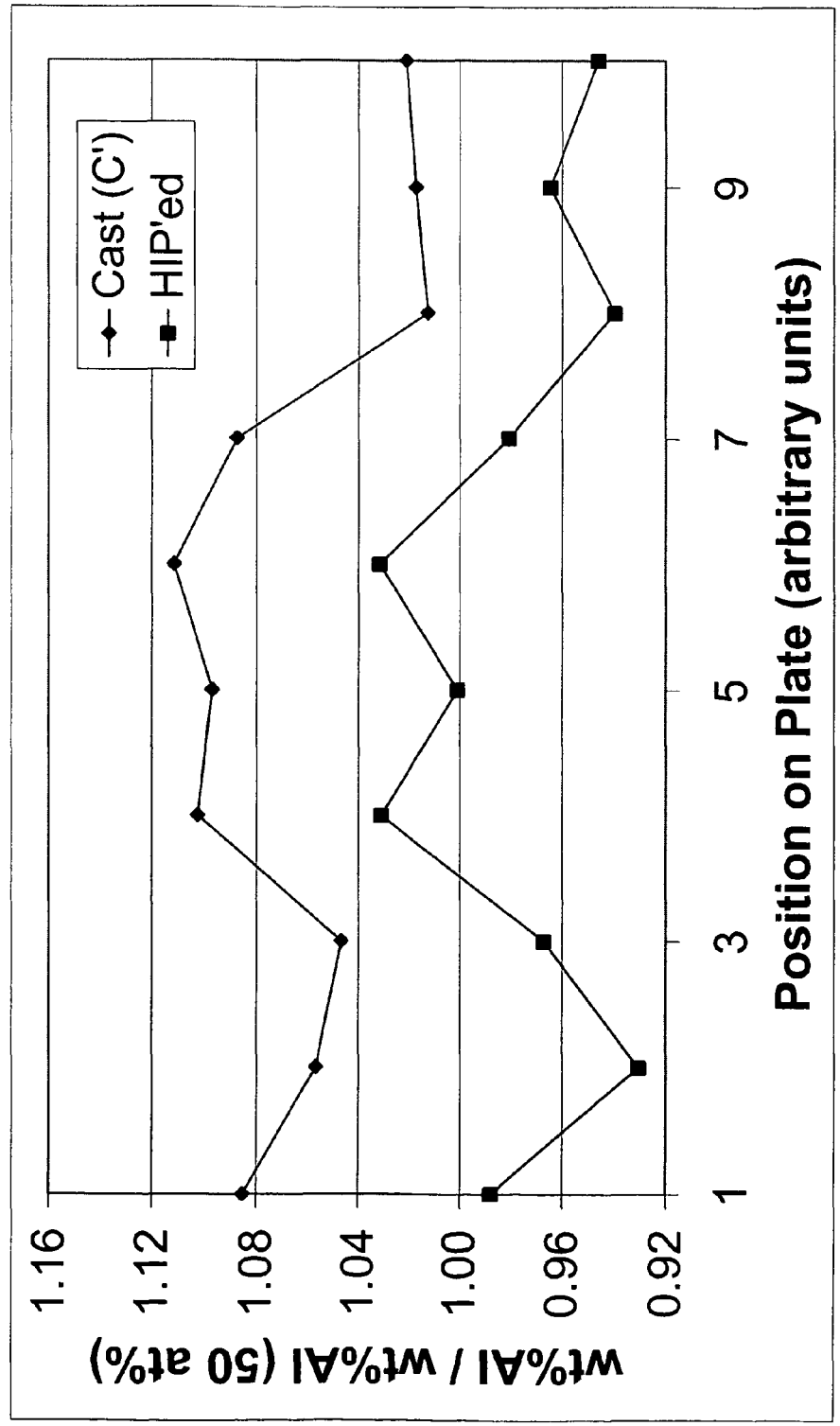

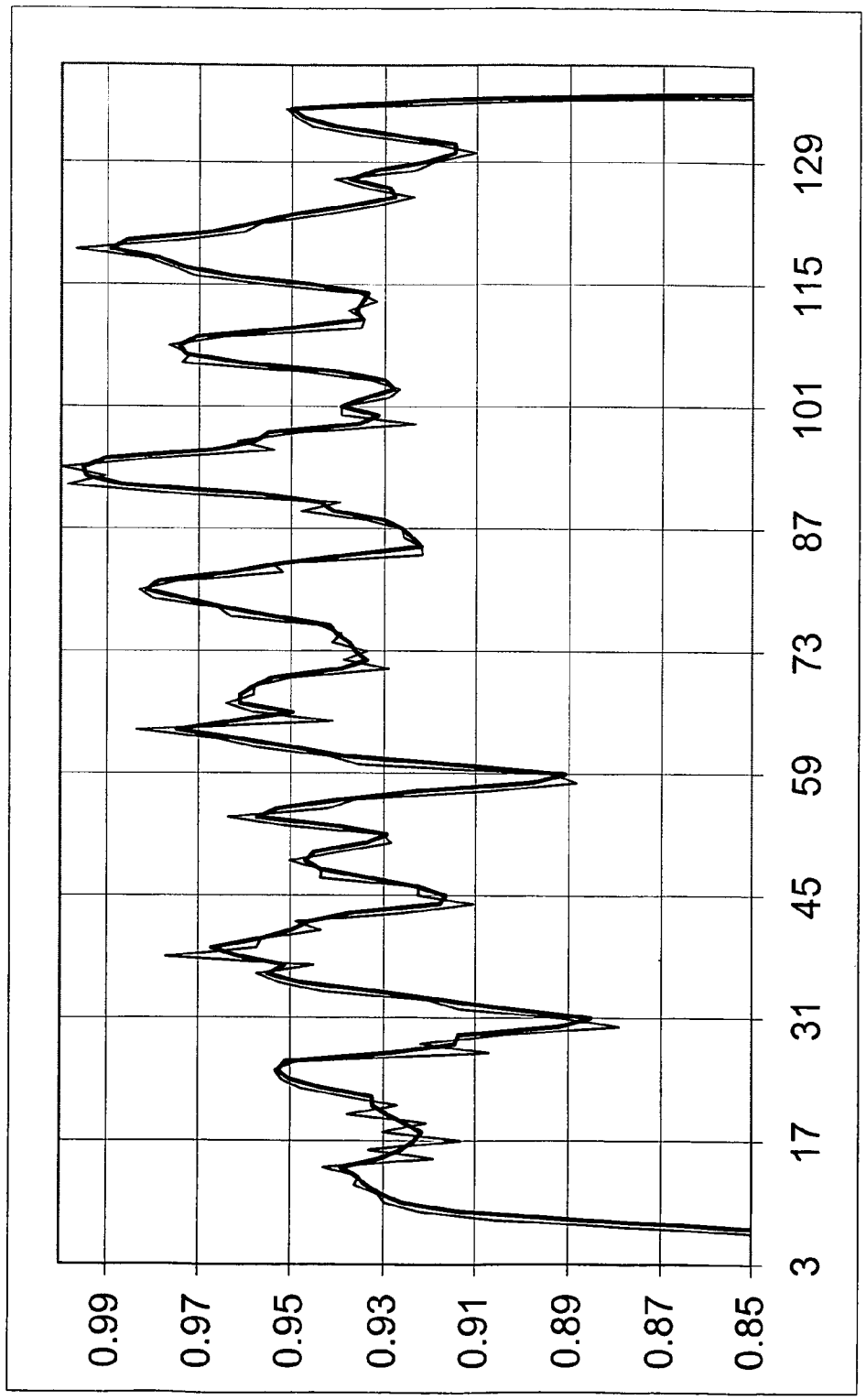
Fig 23 – SNMS depth analysis of Al concentration

EFFECTS OF METHODS OF MANUFACTURING SPUTTERING TARGETS ON CHARACTERISTICS OF COATINGS

CROSS REFERENCE TO RELATED APPLICATION

This application claims the benefit of U.S. Provisional Application Ser. No. 60/565,552 filed Apr. 27, 2004, which is herein incorporated by reference in its entirety.

BACKGROUND OF THE INVENTION

1. Field of the Invention

The present invention relates generally to coatings comprising titanium and aluminum on substrates, methods for forming the coatings, and titanium and aluminum-containing materials as sputtering targets.

2. Description of Technical Considerations

Technology for depositing specific types of metallic or metal oxide-containing coatings on larger area substrates includes vapor deposition, such as chemical vapor deposition; spray pyrolysis; sol-gel; and sputtering, such as magnetic sputtering vapor deposition ("MSVD"). Larger area substrates of around 1 square foot (30 square centimeters) and larger provide challenges in economically consistent production of quality coated substrates by virtue of the size of the substrate that is coated. Consistency in coating uniformity and reduction of defects in the coating of larger areas require equipment that is able to handle the larger substrates, the volume of coating material, and the fabrication of the coated substrate. Such equipment is generally more expensive to purchase and operate; thus making efficient operation of the equipment imperative for cost-effective production.

Specific metal-containing (metals and/or metal oxides) coatings on substrates can exist as multi-layered coatings in which each layer is comprised of the same or different materials from one or more applications of the coating materials or precursors. Also, a layer of the coating can have one or more films from more than one application of the same or different materials. Examples of multi-layered coatings on a substrate are conventional silver-based low emissivity coatings that are deposited on both glass and plastic substrates, generally by sputtering.

In sputtering to deposit metals and metal oxides on larger surface area substrates, such as sheets or panels of light transmitting materials (e.g., plastic or glass), cathode targets have been used of the specific metal for deposition as the metal or metal oxide on the substrate. For larger area substrates of plastic and glass, such as or metal oxide on the substrate. For larger area substrates of plastic and glass, such as float glass with a surface area of at least 1 square foot (30 square centimeters), elongated cathode targets have been used. The targets are elongated to a length substantially the length or width of the substrate to be coated. For example, U.S. Pat. Nos. 4,990,234 and 5,170,291 to Szczyrbowski et al. and U.S. Pat. No. 5,417,827 to Finley disclose sputtering silica and silicides, such as transition metal silicide ($NiSi_2$), in an oxidizing atmosphere to deposit dielectric oxide films.

U.S. Pat. No. 5,320,729 to Narizuka et al. discloses a sputtering target with which a high resistivity thin film consisting of silicon, titanium and aluminum, and oxygen can be produced. The target is formed by selecting the grain size of silicon powder and titanium and aluminum dioxide powder drying the powders by heating and mixing the dried powders to obtain a mixed powder containing from 20 to 80 percent by weight of silicon, for example 50 to 80 percent, the remainder being titanium and aluminum dioxide, packing the mixed powder in a die, and sintering the packed powder by hot pressing to produce a target which has a two-phase mixed structure. The sputtering target is used to manufacture thin film resistors and electrical circuits.

Sputtering cathode targets of various metallic materials are useful in vacuum deposited low emissivity ("Low-E") coating stacks which usually have the following general layer sequence: $S/(D_1/M/P/D_2)^R$ where:

S is a substrate, such as a transparent substrate like glass;

$D_1$ is a first transparent dielectric layer, usually a metal oxide, and can include one or more transparent dielectric films;

M is an infrared reflective layer, usually silver or other noble metal;

P is a primer layer to protect the underlying infrared reflective layer;

$D_2$ is a second transparent dielectric film similar to $D_1$; and

R is an integer equal to or greater than one and is the number of repetitions of the above layers.

The dielectric layers, $D_1$ and $D_2$, adjust the optical properties of the coating stack. These layers also provide some physical and chemical protection to the fragile infrared reflective layer(s). Unfortunately, many process-friendly and cost-effective dielectric materials are often susceptible to abrasion and corrosion as well. For example, zinc oxide, e.g., as disclosed in U.S. Pat. No. 5,296,302, which usually forms a crystalline film, is susceptible to attack by acids and bases; bismuth oxide, which usually forms an amorphous film, is soluble in certain acids; tin oxide, which usually forms an amorphous film, is susceptible to attack in certain basic environments.

The P primer or blocker layers, as they are known in the art, are incorporated into such low emissivity coatings to protect the M layer or film from oxidation during the sputtering process. The M layer, like silver, is susceptible to breakdown during deposition of the overlying dielectric layer or film if the oxygen to reactive gas ratio is high, e.g., greater than 20 percent of the gas volume. The primer layers, which can be composed of pure metal layers or ceramic layers, act as sacrificial layers by preferentially oxidizing to protect the underlying silver layer or film. Generally thicker primer layers are necessary if the low emissivity coating is to survive the high temperature of a glass fabrication process (up to 650° C. or 1202° F.), e.g., bending and tempering of soda-lime glass.

To reduce corrosion, some Low-E coating stacks have an overlaying protective overcoat of a chemically-resistant dielectric layer. This layer has desirable optical properties, manageable sputter deposition characteristics, and is compatible with other materials of the coating stack. The titanium dioxide films disclosed in U.S. Pat. Nos. 4,716,086 and 4,786,563 are protective films having the above qualities. There are other chemically-resistant materials that have limitations, e.g., are more challenging to sputter. Silicon oxide disclosed in Canadian Patent No. 2,156,571, aluminum oxide and silicon nitride disclosed in U.S. Pat. Nos. 5,425,861; 5,344,718; 5,376,455; 5,584,902; and 5,532,180, and in PCT International Publication No. WO 95/29883 are examples of such materials. The sputtered multi-layered silver-based low emissivity coatings and glass with these coatings are used in automotive and window glazing applications.

It is known that the primer layer continues to oxidize during high temperature processing, and it is desirable for the oxidation to continue to completion in order to reduce visible light absorption from the primer layer. This effect is better utilized for metals that form metal oxides with low absorption coefficients, e.g., titanium and aluminum. For performance glazing applications, this leads to a higher visible light transmission to infrared transmittance ratio. If the oxidation continues beyond consumption of the primer layer to full oxidation, the coating can degrade and performance can suffer. Metal ions in the dielectric layers can inter-diffuse with the silver layer, and the well-defined interface can become fuzzy. This can lead to a loss of the antireflective behavior and loss of a continuous silver layer. The degree of oxidation of the primer is related to several factors, including the reactivity of the metal (Gibbs free energy), the density of the oxide formed during heating, and the diffusion or dissolution of oxygen in the oxide or metal. For example, a metal, such as titanium, in a thin film of less than around 20 Angstroms will pass through several oxidation states before reaching the thermally stable phase of $TiO_2$. Titanium has been a preferred choice of material for primer layers in low emissivity multi-layered coatings.

The technology of metal and metallic coatings and multi-layered coatings would be advanced by a more chemically and/or mechanically durable coating that could be used as a protective coat for the substrate or multi-layered coated substrate or also useful as a dielectric or primer layer in multi-layered coatings on substrates. Additionally, it would be advantageous to provide methods for forming coatings having a more uniform concentration across the substrate to provide more uniform coating properties over the substrate. Moreover, it would be advantageous to provide a coating of differing concentration across the substrate if so desired to form areas of differing coating properties.

SUMMARY OF THE INVENTION

The present invention involves coatings of at least mixtures of titanium and aluminum-containing materials on flat and/or curved substrates that can be larger than at least 1 square foot (30 squaretcentimeters). In one non-limiting embodiment of the invention, the titanium and alumirium-containing coatings ("Ti—Al coating") have a weight ratio of titanium-containing materials to aluminum-containing materials, respectively, in the range of around 99:1 to 1:99 for the mixture of titanium and aluminum-containing materials ("Ti—Al containing materials"), such as 40 to 80 titanium to 20 to 60 aluminum, such as 50 to 80 titanium to 20 to 50 aluminum, such as 50 to 70 titanium to 30 to 50 aluminum, such as 60 to 70 titanium to 30 to 40 aluminum. Application of the Ti—Al containing materials can be via several coating techniques well know in the art, such as but not limited to vapor deposition, spray pyrolysis, sol gel and/or sputtering methods. The flat or curved substrates can be, but are not limited to, non-metallic uncoated base substrates, plastics, PET, glass, light-transmitting substrates, and already coated variations of these substrates and the like in the form of flat, curved or contoured substrates.

In one non-limiting embodiment of the present invention, the Ti—Al coating is deposited by sputtering Ti—Al containing materials from cathode targets. These targets can be elongated planar or cylindrical targets comprised of at least titanium and aluminum mixtures or alloys. The targets can also have other materials, such as transition metals, like silicon, silicon-transition metal, or transition metal and/or silicon. The targets can also have other materials to affect the conductivity of the cathode target. Targets of titanium and aluminum mixtures can be sputtered in an atmosphere comprising inert gas, nitrogen, oxygen, and/or mixtures thereof to produce titanium and aluminum metal-containing coatings including oxides, nitrides and oxynitrides, as well as metallic films on substrates. The titanium and aluminum metal cathode target compositions of the present invention comprise sufficient metal to provide target stability and a desirable sputtering rate.

The titanium and aluminum-containing targets, which as oxides, nitrides and/or oxynitrides materials are very hard and chemically resistant, produce sputtered mechanically and/or chemically durable titanium and aluminum mixture or alloy compound coatings. When the Ti—Al mixtures are sputtered in pure argon, or in an oxygen and argon gas mixture, the resultant titanium and aluminum mixture coating is more chemically resistant than titanium and aluminum alone and harder than titanium oxide alone.

A purpose of these titanium and aluminum mixtures is to provide target materials that sputter readily in inert gas, reactive gas or gas mixtures, to produce extremely durable coatings with variable optical properties. Each target-material combination can produce coatings with different optical constants, i.e., refractive index and absorption coefficient. When sputtered reactively, each target material combination can also produce coatings with a range of optical constants, which generally increase as the reactive gas mixture, with or without inert gas, such as argon, is varied from oxygen, to combinations of oxygen and nitrogen with increasing proportions of nitrogen, to nitrogen.

In one embodiment of the present invention, the coatings with Ti—Al mixtures permit a widening of the range of the oxidation of the primer layers and better control of the thermal processing of the low emissivity coatings.

In one non-limiting embodiment, the invention provides a method for forming coatings having a difference in composition versus depth using a single cathode.

In another non-limiting embodiment, the invention provides a method of forming a coating having a more uniform composition with respect to coating depth than with conventional coating methods.

BRIEF DESCRIPTION OF THE DRAWINGS

FIG. 21 is a graph of normalized thickness versus plate position for cast and HIPed cathodes;

FIG. 22 is a graph of aluminum concentration versus plate position for cast and HIPed cathodes, and FIG. 23 is a graph of aluminum concentration versus depth for a titanium/aluminum coating sputtered with the cast cathode of FIG. 22.

DESCRIPTION OF THE INVENTION

Figure 1:
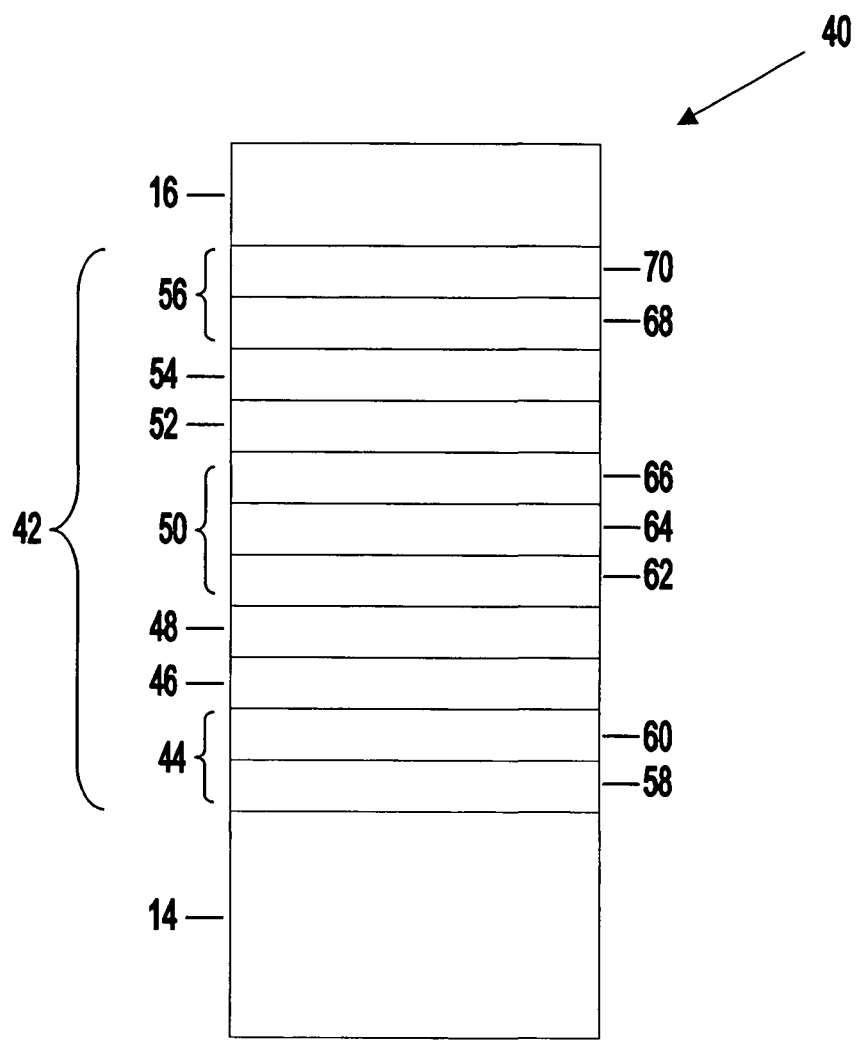
FIG. 1 is a sectional view (not to scale) of a coated article incorporating features of the invention.

As used herein, the terms "coating film" or "film" refer to a region of a desired or selected coating composition. A "coating layer" or "layer" can include one or more coating films. A "coating stack" or "stack" includes one or more coating layers. As used herein, spatial or directional terms, such as "left", "right", "inner", "outer", "above", "below", "top", "bottom", and the like, relate to the invention as it is shown in the drawing figures. However, it is to be understood that the invention can assume various alternative orientations and, accordingly, such terms are not to be considered as limiting. Further, as used herein, all numbers expressing dimensions, physical characteristics, processing parameters, quantities of ingredients, reaction conditions, and the like, used in the specification and claims are to be understood as being modified in all instances by the term "about". Accordingly, unless indicated to the contrary, the numerical values set forth in the following specification and claims can vary depending upon the desired properties sought to be obtained by the present invention. At the very least, and not as an attempt to limit the application of the doctrine of equivalents to the scope of the claims, each numerical value should at least be construed in light of the number of reported significant digits and by applying ordinary rounding techniques. Moreover, all ranges disclosed herein are to be understood to encompass the beginning and ending range values and any and all subranges subsumed therein. For example, a stated range of "1 to 10" should be considered to include any and all subranges between (and inclusive of) the minimum value of 1 and the maximum value of 10; that is, all subranges beginning with a minimum value of 1 or more and ending with a maximum value of 10 or less, e.g., 1 to 7.2, or 3.5 to 6.1, or 5.5 to 10, just to illustrate a few. The terms "flat" or "substantially flat" substrate refer to a substrate that is substantially planar in form; that is, a substrate lying primarily in a single geometric plane, which substrate, as would be understood by one skilled in the art, can include slight bends, projections, or depressions therein. Further, as used herein, the terms "deposited over", "applied over", or "provided over" mean deposited, applied, or provided on but not necessarily in contact with the surface. For example, a coating "deposited over" a substrate does not preclude the presence of one or more other coating films of the same or different composition located between the deposited coating and the substrate. For instance, the substrate itself can include a coating such as those known in the art for coating substrates, such as glass and ceramics. All references referred to herein are to be understood to be incorporated by reference in their entirety.

The instant invention relates to titanium and aluminum-containing films or layers that can be used as dielectric, primer, and/or protective layers or films that can protect all or selected ones of the underlying coating layers or films of a coating stack from mechanical wear and/or chemical attack. In the following discussion, the embodiments of the invention can protect underlying infrared reflective metal layers or films as part of a functional film or layer and metal oxide layers of the type present in any conventional type of coating stack.

The titanium and aluminum-containing films or layers of the present invention can be formed or deposited over substrates by various methods, such as but not limited to sol gel, vapor deposition, and sputtering.

For both the CVD and the spray pyrolysis methods of coating the titanium aluminum materials of the present invention, the temperature of the substrate during formation of the coating thereon should be within the range that will cause the metal containing precursor to decompose and form a coating. As should be appreciated, the lower limit of this temperature range is largely affected by the decomposition temperature of the selected metal-containing precursor. For the titanium-containing precursors, like those of U.S. Pat. No. 6,027,766 (Greenberg et al.) and others well known in the art, the minimum temperature of the substrate which will provide sufficient decomposition of the precursor is typically within the temperature range of 400° C. (752° F.) to 500° C. (932° F.). The upper limit of this temperature range can be affected by the substrate being coated. For example, where the substrate is a glass float ribbon and the coating is applied to the float ribbon during manufacture of the float ribbon, the float glass can reach temperatures in excess of 1000° C. (1832° F.). The float glass ribbon is usually attenuated or sized (e.g., stretched or compressed) at temperatures above 800° C. (1472° F.). If the coating is applied to the float glass before or during attenuation, the coating can crack or crinkle as the float ribbon is stretched or compressed, respectively. Therefore, in one practice of the invention, the coating is applied when the float ribbon is dimensionally stable, e.g., below 800° C. (1472° F.) for soda-lime-silica glass, and the float ribbon is at a temperature to decompose the metal-containing precursor, e.g., above 400° C. (752° F.). Forming a coating by CVD or spray pyrolysis methods is particularly well suited for practice during the manufacture of the glass float ribbon. In general, a glass float ribbon is manufactured by melting glass batch materials in a furnace and delivering the refined molten glass onto a bath of molten tin. The molten glass on the bath is pulled across the tin bath as a continuous glass ribbon while it is sized and controllably cooled to form a dimensionally stable glass float ribbon. The float ribbon is removed from the tin bath and moved by conveying rolls through a lehr to anneal the float ribbon. The annealed float ribbon is then moved through cutting stations on conveyor rolls where the ribbon is cut into glass sheets of desired length and width. U.S. Pat. Nos. 4,466,562 and 4,671,155 provide a discussion of the float glass process.

Temperatures of the float ribbon on the tin bath generally range from 1093° C. (2000° F.) at the delivery end of the bath to 538° C. (1000° F.) at the exit end of the bath. The temperature of the float ribbon between the tin bath and the annealing lehr is generally in the range of 480° C. (896° F.) to 580° C. (1076° F.); the temperatures of the float ribbon in the annealing lehr generally range from 204° C. (400° F.) to 557° C. (1035° F.) peak.

U.S. Pat. Nos. 4,853,257; 4,971,843; 5,464,657; and 5,599,387 describe CVD coating apparatus and methods that can be used in the practice of the invention to coat the float ribbon during manufacture thereof. Because the CVD method can coat a moving float ribbon yet withstand the harsh environments associated with manufacturing the float ribbon, the CVD method is well suited to provide the coating on the float ribbon.

The CVD coating apparatus can be employed at several points in the float ribbon manufacturing process. For example, CVD coating apparatus can be employed as the float ribbon travels through the tin bath after it exits the tin bath, before it enters the annealing lehr, as it travels through the annealing lehr, or after it exits the annealing lehr.

As can be appreciated by those skilled in the art, concentration of the metal-containing precursor in the carrier gas, the rate of flow of the carrier gas, the speed of the float ribbon (the "line speed"), the surface area of the CVD coating apparatus relative to the surface area of the float ribbon, the surface areas and rate of flow of exhausted carrier gas through exhaust vents of the CVD coating apparatus, more particularly, the ratio of exhaust rate through the exhaust vents versus the carrier gas input rate through the CVD coating unit, known as the "exhaust matching ratio", and the temperature of the float ribbon are among the parameters which will affect the final thickness and morphology of the coating formed on float ribbon by the CVD process.

U.S. Pat. Nos. 4,719,126; 4,719,127; 4,111,150; and 3,660,061 describe spray pyrolysis apparatus and methods that can be used with the float ribbon manufacturing process. While the spray pyrolysis method, like the CVD method, is well suited for coating a moving float glass ribbon, the spray pyrolysis has more complex equipment than the CVD equipment and is usually employed between the exit end of the tin bath and the entrance end of the annealing lehr.

As can be appreciated by those skilled in the art, the constituents and concentration of the pyrolytically-sprayed aqueous suspension, the line speed of the float ribbon, the number of pyrolytic spray guns, the spray pressure or volume, the spray pattern, and the temperature of the float ribbon at the time of deposition are among the parameters which will affect the final thickness and morphology of the coating formed on the float ribbon by spray pyrolysis.

As is known by those skilled in the art, the surface of the glass float ribbon on the molten tin (commonly referred to as the "tin side") has diffused tin in the surface which provides the tin side with a pattern of tin absorption that is different from the opposing surface not in contact with the molten tin (commonly referred to as "the air side"). This characteristic is discussed in Chemical Characteristics of Float Glass Surfaces, Seiger, J., JOURNAL OF NON-CRYSTALLINE SOLIDS, Vol. 19, pp. 213-220 (1975); Penetration of Tin in The Bottom Surface of Float Glass: A Synthesis, Columbin L. et al., JOURNAL OF NON-CRYSTALLINE SOLIDS, Vol. 38 & 39, pp. 551-556 (1980); and Tin Oxidation State, Depth Profiles of S-i 2+ and SnA-+ and oxygen Diffusivity in Float Glass by Mbssbauer Spectroscop, Williams, K. F. E. et al., JOURNAL OF NON-CRYSTALLINE SOLIDS, Vol. 211, pp. 164-172 (1997). As can be appreciated by those skilled in the art, a coating can be formed on the air side of the float ribbon while it is supported on the tin bath (by the CVD method); on the air side of the float ribbon after it leaves the tin bath by either the CVD or spray pyrolysis methods, and on the tin side of the float ribbon after it exits the tin bath by the CVD method.

U.S. Pat. Nos. 4,379,040; 4,861,669; 4,900,633; 4,920,006; 4,938,857; 5,328,768; and 5,492,750 describe MSVD apparatus and methods to sputter coat metal oxide films on a substrate, including a glass substrate. The MSVD process is not generally compatible with providing a coating over a glass float ribbon during its manufacture because, among other things, the MSVD process requires negative pressure during the sputtering operation, which is difficult to form over a continuous moving float ribbon. However, the MSVD method is acceptable to deposit the coating over the substrate, e.g., a glass sheet. As can be appreciated by those skilled in the art, the substrate can be heated to temperatures in the range of 400° C. (750° F.) to 500° C. (932° F.) so that the MSVD sputtered coating on the substrate crystallizes during deposition process, thereby eliminating a subsequent heating operation.

The coated substrate can be heated during the sputtering operation. The sputter coating can be crystallized within the MSVD coating apparatus directly and without post heat treatment by using high energy plasma and/or ion bombardment.

One method to provide a coating using the MSVD method is to sputter a coating on the substrate, remove the coated substrate from the MSVD coater and thereafter heat treat or treat by using atmospheric plasmas on the coated substrate to crystallize the sputter coating. For example, but not limiting to the invention, with the MSVD method, a target of titanium metal and aluminum metal sputtered in an argon/oxygen atmosphere having 40 to 100% oxygen, the remainder argon gas mixture, for example 50 to 80 percent oxygen, the remainder argon gas mixture, at a pressure of 5-10 millitorr to sputter deposit a coating of titanium aluminum oxide at the desired thickness on the substrate. The coating as deposited may not be crystallized. The coated substrate can be removed from the coater and heated to a temperature in the range of 400° C. (752° F.) to 600° C. (1112° F.) for a time period sufficient to promote formation of the crystalline forms of titanium aluminum oxide and mixtures and oxide compounds of titanium and aluminum. Where the substrate is a glass sheet cut from a glass float ribbon, the coating can be sputter deposited on the air side and/or the tin side.

In one aspect of the present invention, oxides, nitrides, and oxynitrides comprising titanium and aluminum, titanium and aluminum-silicon, titanium and aluminum-silicon-transition metal can be sputtered using dc magnetron sputtering. For this purpose, titanium and aluminum, with or without other materials such as silicon or transition metals, can be used for the sputtering targets. Coating transmittance and reflectance are measured as an indicator of the optical properties of refractive index and absorption coefficient. Electrical sheet resistance in ohms per square is measured as an indicator of the emissivity and the solar performance, i.e., the solar energy transmitted and reflected. A decrease in sheet resistance indicates an enhancement in these properties.

In one non-limiting embodiment of the invention, titanium and aluminum and titanium aluminum-silicon mixture or alloy cathode targets can have a weight ratio of titanium-containing materials to aluminum-containing materials ranging between 1 to 99 weight percent aluminum and 99 to 1 weight percent titanium, for example 10 to 95 weight percent aluminum, or 20 to 80 weight percent aluminum, or 20 to 60 weight percent aluminum, such as 20 to 50 weight percent aluminum, such as 20 to 40 weight percent aluminum, such as 30 to 40 weight percent aluminum. The metals of titanium, aluminum with or without silicon can be sputtered in argon, nitrogen, and/or oxygen; for example in an argon-oxygen gas mixture with up to 100 percent oxygen, or in a nitrogen-oxygen gas mixture containing up to 95 percent oxygen. Titanium-aluminum-silicon alloy cathode targets can have some of the silicon substituted with transition metal. In one non-limiting embodiment if the invention, the amount of transition metal is below 15 percent by weight based on the combined weight of titanium and aluminum, silicon and transition metal, for example in the range of 5 to 15 percent, with at least 5 percent silicon based on the total weight of titanium and aluminum, silicon and transition metal.

Titanium and aluminum-silicon-transition metal alloy cathode targets with 5 to 15 weight percent transition metal and 5 to 65 weight percent silicon, for example 5 to 10 weight percent transition metal, and 5 to 40 weight percent silicon, can be sputtered, for example, in inert gas such as argon, in 100% oxygen, in argon-oxygen gas mixtures, or in nitrogen-oxygen gas mixtures containing up to 95 percent oxygen. In one non-limiting embodiment of the invention, titanium and aluminum-transition metal alloy cathode targets can contain up to 20 weight percent transition metal based on the combined weight of titanium and aluminum, but can contain more transition metal or other transition metal subject to the limitation that the alloy remain nonmagnetic for magnetron sputtering.

The titanium and aluminum, titanium aluminum-silicon, titanium-aluminum-silicon-transition metal, and titanium and aluminum-transition metal cathode target compositions of the present invention can be determined by chemical analysis from pieces of target material to determine weight percent of silicon, or transition metal. The coating compositions can be measured using X-ray fluorescence to determine the weight percent titanium, aluminum, silicon, or transition metal.

The targets can be generally elongated having a length larger than their width and ranging from 30 up to 100 centimeters or more. In one embodiment of the present invention, coatings can be produced on a large-scale magnetron sputtering device capable of coating glass up to 100×144 inches (2.54×3.66 meters).

The article having at least one film or layer of titanium and aluminum materials of the present invention in a coating can be an article having a sputtered Low-E coating stack on a substrate. The titanium and aluminum material containing coating can be a protective layer over the coating stack. The substrate can be made of any material, e.g., plastic, glass, metal or ceramic. In one non-limiting embodiment of the invention, the substrate is transparent, e.g., nylon, glass or Mylar® plastic sheet. In the following discussion, the substrate is glass. The glass can be of any composition having any optical properties, e.g., any value of visible transmittance, ultraviolet transmission, infrared transmission and/or total solar energy transmission. Types of glasses that can be used in the practice of the invention, but not limited thereto, are disclosed in U.S. Pat. Nos. 4,746,347; 4,792,536; 5,240,886; 5,385,872; and 5,393,593.

The sputtered coating stack can have any arrangement including, but is not limited to, a base layer also referred to as a dielectric layer, a phase matching layer or an antireflective layer; an infrared reflecting metal layer, such as a silver film or any noble metal; a primer or protective layer, which can be, but is not limited to, a deposited stainless steel film, a niobium film, a deposited copper film or a deposited titanium film, and a second dielectric layer or antireflective layer. Coating stacks that are single silver film coating stacks that can be used in the practice of the invention, but not limiting to the invention, are disclosed in U.S. Pat. Nos. 4,320,155; 4,512,863; 4,594,137; and 4,610,771.

For one specific coated glass, the dielectric layers can have zinc stannate; the primer layer can be deposited as metallic copper, and the IR layer can be silver. Although not required, the base layer can be deposited on the air surface of a glass sheet cut from a float glass ribbon. The air surface is the surface opposite the surface of the float ribbon supported on the molten pool of metal, e.g., as disclosed in U.S. Pat. No. 4,055,407. An exemplary coating stack as described above is disclosed in the above-mentioned U.S. Pat. Nos. 4,610,771 and 4,786,563.

The titanium and aluminum-containing layer, e.g., protective layer, of the instant invention is discussed below in combination with one non-limiting configuration of a functional coating stack, but it should be appreciated that the protective layer can be used with many different types of functional coatings known to those skilled in the art.

With reference to FIG. 1, there is shown a coated article 40 having a functional coating stack 42 of a type typically found in Low E sputter coated articles having two infrared reflective metal layers. The coating stack 42 is carried on a substrate 14. In general, the coating stack 42 includes a base layer 44 that can include one or more films of different dielectric materials or antireflective materials or phase matching materials, a first infrared reflective metal layer 46, a primer layer 48 to prevent degradation of the metal layer 46 during sputtering of a dielectric layer or anti-reflective layer or phase matching layer 50. The layer 50 can have one or more films. A second infrared reflective metal layer 52 is deposited over the layer 50. A second primer layer 54 is deposited on the second infrared metal reflective layer 52 and a dielectric layer or anti-reflective layer 56 is deposited over the second primer layer 54.

In one non-limiting embodiment of the invention and with continued reference to FIG. 1, a double metal layer reflective coating stack 42 that can be used in the practice of the invention includes a base layer 44 comprising a zinc-stannate film 58 on the air surface of a glass substrate 14 cut from a float glass ribbon, and a zinc-oxide film 60 on the zinc-stannate film 58; a first infrared-reflective metal layer 46 comprising a silver film on the zinc oxide film 60; a first primer layer 48 comprising a sputtered titanium metal film on the silver film 46, wherein the titanium metal oxidizes to titanium dioxide film 48 during sputtering of the next dielectric film; a dielectric layer 50 comprising a zinc-oxide film 62 on the primer layer 48, a zinc-stannate film 64 on the zinc-oxide film 62, and a zinc-oxide film 66 on the zinc-stannate film 64; a second infrared-reflective layer 52 comprising a second silver film on the zinc-oxide film 66; a second primer layer 54 comprising a second titanium metal film deposited on the silver film 52, wherein the titanium is oxidized to titanium dioxide as previously discussed; a dielectric layer 56 comprising a zinc-oxide film 68 over the titanium oxide film 54 and a zinc-stannate film 70 on the zinc-oxide film 68. The coating stack 42 is of the type disclosed in published EPO Application No. 0 803 381 based on U.S. patent application Ser. No. 08/807,352 filed on Feb. 27, 1997, in the names of Mehran Arbab, Russell C. Criss, and Larry A. Miller for "Coated Articles", and in products sold by PPG Industries, Inc., under its trademark SUNGATE® 1000 coated glass and SOLARBAN® 60 coated glass.

The protective layer or film 16 of the instant invention discussed in more detail below is deposited over the coating stack 42. The deposition of the functional coating 42 is not limiting to the invention and can be deposited by any method, e.g., by sputter deposition, electroless metal deposition, and/or pyrolytic deposition. Alternatively, the functional coating can comprise one or more conductive metal nitrides, e.g., titanium nitride, and alloys of nickel and chrome.

It is to be understood that the invention is not limited to the embodiment shown in FIG. 1. For example, the titanium and aluminum-containing layer (e.g., protective layer) of the invention can be utilized as an overcoat layer 16 as shown in FIG. 1. However, the titanium and aluminum-containing layer of the invention could also be used as one or both of the primer layers 48 and/or 54, or as an additional layer, or in place of one or more of the dielectric layers 44, 50, 56.

The protective layer 16 of the instant invention can be the last deposited layer on the coating stack or can be an underlying layer for outermost layer. For example, the Ti—Al protective layer 16 of the instant invention can be deposited as the last film of the functional coating to provide protection against mechanical and chemical attack at least equal to presently known and used protective films. Alternatively, the Ti—Al layer 16 can be utilized as one or more of the layers, e.g., primer layers or dielectric layers, of the coating stack.

In one non-limiting embodiment of the invention, the protective coating 16 further comprises silicon. This can be accomplished by adding silicon to the titanium-aluminum target. When a titanium-aluminum-silicon cathode target is used to sputter a coating in an inert atmosphere, the deposited material can include titanium, aluminum, silicon, titanium-aluminum, titanium-silicon, aluminum-silicon, titanium-aluminum-silicon, and combinations thereof. When a titanium-aluminum-silicon cathode target is used to sputter a coating in an oxygen atmosphere, the deposited material can include titanium oxide, aluminum oxide, silicon oxide, (titanium-aluminum) oxide, (titanium-silicon) oxide, (aluminum-silicon) oxide, (titanium-aluminum-silicon) oxide, and combinations thereof. When a titanium-aluminum-silicon cathode target is used to sputter a coating in nitrogen atmosphere, the deposited material can include titanium nitride, aluminum nitride, silicon nitride, (titanium-aluminum) nitride, (titanium-silicon) nitride, (aluminum-silicon) nitride, (titanium-aluminum-silicon) nitride, and combinations thereof. When a titanium-aluminum-silicon cathode target is used to sputter a coating in air, the deposited material can include titanium oxide, aluminum oxide, silicon oxide, (titanium-aluminum) oxide, (titanium-silicon) oxide, (aluminum-silicon) oxide, (titanium-aluminum-silicon) oxide, titanium nitride, aluminum nitride, silicon nitride, (titanium-aluminum) nitride, (titanium-silicon) nitride, (aluminum-silicon) nitride, (titanium-aluminum-silicon) nitride, titanium oxynitride, aluminum oxynitride, silicon oxynitride, (titanium-aluminum) oxynitride, (titanium-silicon) oxynitride, (aluminum-silicon) oxynitride, (titanium-aluminum-silicon) oxynitride, and combinations thereof.

In the practice of the invention, silicon with combinations of oxides, nitrides, and oxynitrides can be used to provide the film of the instant invention. As discussed in the following, titanium, aluminum oxide, nitride or combinations of oxide, nitride or oxynitride as dielectric and/or protective layers offer durable coatings with increased flexibility in the choice of color and reflectance.

The dielectric and/or protective layer of the instant invention can be "homogeneous", "graded" or "non-homogeneous".

In the following examples, unless otherwise stated, the coatings were deposited on a smaller scale, using planar magnetron cathodes having 5×17 inch (12.7×43.2 centimeters) titanium-aluminum and titanium-aluminum-silicon targets. Base pressure was in the low $10^{-5}$ to $10^{-6}$ torr range. The coatings were made by first admitting the sputtering gas to a pressure ranging from 3 to 4 millitorr and then setting the cathode at a constant power. In each example, clear float glass substrates were passed under the target on a conveyor roll at a speed of 120 inches (3.05 meters) per minute. The transmittance was monitored during the sputtering process at a wavelength of 550 nanometers using a Dyn-Optics 580D optical monitor.

After the coating was deposited, the transmittance and reflectance from both the glass and coated surface were measured in the wavelength range from 380 to 720 nanometers using a TCS spectrophotometer manufactured by BYK Gardner in Columbia, Md. This data was used with a commercially available software program to calculate the coating refractive index (n) and absorption coefficient (k), the integrated transmittance and reflectance. The thicknesses of the coatings were measured using a Tencor P-1 Long Scan Profiler.

EXAMPLES

It was found that films containing a combination of Ti and Al produced several surprising features. Ranges of the metal mixture showed preferential oxidation, relative to either of the pure metals of titanium or aluminum films. Independently of this, an enhancement of the low emissivity coating was realized when the metal mixture was incorporated as a primer layer. A dramatic improvement in the long-term exposure to the environment of a thermally processed coating was observed. A range of the mixed metal primer showed no breakdown, compared to the pure metal primers after more than 1.5 years of exposure in the lab environment. In addition, the sheet resistance of the low emissivity coating was lower for a range of the metal mixture than either of the pure metal primers. Both of these benefits clearly indicate an improvement over the pure metal primers in the art.

Titanium-aluminum oxide and nitride coatings showed greatly enhanced chemical durability compared to a titanium dioxide coating, as indicated by exposure to condensing humidity testing.

To produce thin film samples composed of a mixture of metals, a planar cathode target, i.e., a solid 5"×14" (12.5 cm×35 cm) pure metal plate, was either a solid target composed of the specific metal mixture or alloy, or a split target divided into two, side-by-side 5"×7" (2.5 cm×17.5 cm) plates of the two metals. Specific Ti—Al alloys were used for the solid targets and were fabricated by Hot Isostatic Pressing (HIP) powders of the alloy, or Vacuum planar Induction skull Melting (VIM) and casting an ingot target from the metal powders, or plasma sprayed. Chemical analysis of the target alloy was used to determine the weight percent of the individual metals. Both the split and the specific alloy targets were bolted to a backing plate and then to the cathode assembly.

The examples are arranged in two general areas: Examples 1-4 describe the Ti—Al sputtered coatings on glass; Examples 5-7 describe Ti—Al layers as part of a low emissivity coating stack.

Example 1

Mixed Metal or Alloys Sputtered from a Split Target of Pure Al and Ti

Samples G1 and G2

The split target produced coatings composed of a mixture of Al—Ti in a single run. This mixture had a (non-linear) gradient composition across the width of the glass sheet, and constant composition in the direction of travel. The gradient samples (G1) (G2) were produced on 12"×12" (30 cm×30 cm)–2.3 mm clear float glass in an Airco ILS chamber. The base pressure in the chamber before sputtering was 1.0×10-5 torr. The Al—Ti target was sputtered at a pressure of 3 microns in a 100% argon gas atmosphere. The power to the cathode target for sample G1 was 1 kilowatt resulting in a voltage of 395 volts and a current of 2.52 amps. The target was passed under the target 3 times at a speed of 120 inches per minute until the transmission was reduced to 20.9%. Sample G2 was deposited at a power of 5 kilowatts, resulting in a voltage of 509 volts and a current of 9.72 amps. After 5 passes under the target, the transmission was reduced to 0.1%. The transmission in the ILS coater is read in the center of the plate, therefore, the transmission reading is approximately that for the center of the gradient layer. The values of the operating parameters for each sample are shown in Table A below.

Figure 2:
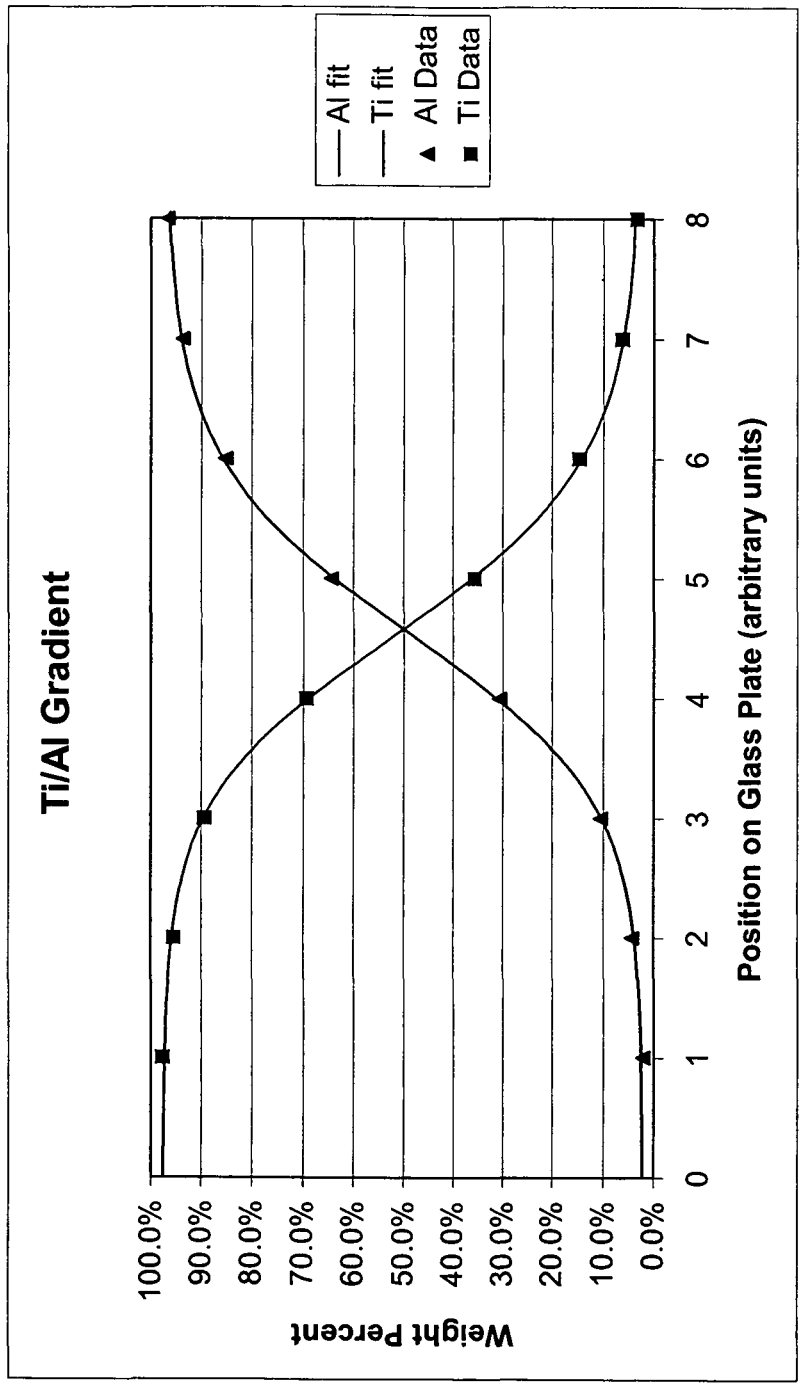
FIG. 2 is a graph of coating composition versus position for a coated glass plate.

After deposition using the split target, a 1.375 inch strip was cut perpendicular to the direction of travel (along the gradient) into eight ~1.375 inch (3.5 cm) squares for X-ray fluorescence (XRF) analysis. The average amount of titanium and aluminum in each individual sample in terms of micrograms/cm$^2$ (μg/cm$^2$) was calculated from these measurements. The weight percentage of Al and Ti was then calculated from the amount of μg/cm$^2$ for each sample. E.g., the center of XRF sample G1, located 3.438 inches (8.7 cm) from the edge of the first sample, contains an average weight of 90.1% titanium. Rather than converting the center position of each XRF sample to inches or centimeters, a template was created marking the center position of each XRF sample along the width of the sample plate. Therefore, G1 has the value 3 units on the template with a 90.1 wt % of titanium. The positions between the centers of each sample are located at a fractional part of the distance between positions on the template. The average composition of the mixed metals was determined by averaging the weight percent of both samples (G1 and G2) for each position along the width of the plate. The micrograms/cm$^2$ and the weight percent for Al and Ti at each position for each sample are shown in Table B, along with the average of the samples at each position. A Sigmoid 5 parameter fit was used to fit the data. The percent of Ti and Al for each position along the width of the plate, and the calculated fit to the data is shown in FIG. 2.

The equation for the data fit is:

Weight %=$y_0 + a/(1+\exp((1+\exp(-(x-x_0)/b))^c$ where
  a=0.9485
  b=0.743
  c=1.2513
  $x_0$=4.3454
  $y_0$=0.0226

TABLE A

| Example # | Voltage | Current | Power (kw) | Number of passes | Transmittance |
|---|---|---|---|---|---|
| G1 | 395 | 2.52 | 1.0 | 3 | 20.9 |
| G2 | 509 | 9.72 | 5.0 | 5 | 0.1 |

TABLE B

| | G1 | | | | G2 | | | | Avg. of G1, G2 | |
|---|---|---|---|---|---|---|---|---|---|---|
| | microgm/cm$^2$ | | wt % | | microgm/cm$^2$ | | wt % | | average wt % | |
| sample position | Al | Ti | Al | Ti | Al | Ti | Al | Ti | Al | Ti |
| 1 | 0.09 | 4.78 | 1.8 | 98.2 | 0.96 | 37.35 | 2.5 | 97.5 | 2.2 | 97.8 |
| 2 | 0.2 | 4.79 | 4.0 | 96.0 | 1.9 | 37.32 | 4.8 | 95.2 | 4.4 | 95.6 |
| 3 | 0.5 | 4.53 | 9.9 | 90.1 | 4.48 | 35.33 | 11.3 | 88.7 | 10.6 | 89.4 |
| 4 | 1.5 | 3.6 | 29.4 | 70.6 | 13.12 | 28.18 | 31.8 | 68.2 | 30.6 | 69.4 |
| 5 | 3.35 | 1.94 | 63.3 | 36.7 | 28.13 | 14.94 | 65.3 | 34.7 | 64.3 | 35.7 |
| 6 | 4.32 | 0.82 | 84.0 | 16.0 | 36.7 | 5.74 | 86.5 | 13.5 | 85.3 | 14.7 |
| 7 | 4.56 | 0.35 | 92.9 | 7.1 | 38.91 | 2.33 | 94.4 | 5.6 | 93.6 | 6.4 |
| 8 | 4.54 | 0.18 | 96.2 | 3.8 | 38.86 | 1.15 | 97.1 | 2.9 | 96.7 | 3.3 |

Results of Oxidation by Heating Mixed Metal or Alloys Sputtered from a Split Cathode.

After the plate described above was heated to the bending point of soda lime glass, it was observed that a section of the plate of metal mixture had oxidized, whereas the pure metal had not. For the Ti—Al mixture, this occurred at a position between 3.5 and 4.0 units on the template as indicated in Table B and FIG. 2. This corresponds to a weight percent of titanium of 85 to 68 weight percent, respectively, as shown in Table B and FIG. 3. The range will be larger for thinner coatings, and narrower for thicker coatings.

The oxidation of the metal mixture makes it possible to apply thicker compositions of Ti—Al metal, e.g., as a metal overcoat layer for subsequent oxidation during thermal processing. The metal mixture layer could also be oxidized by other methods that drive the temperature of the coating to the point of oxidation.

The metal mixture may segregate after heating, producing a layer with one metal richer than the other.

The metal mixture can also be sputtered in a gas mixture with a small percentage of a reactive gas ($O_2$ or $N_2$), below the switch point.

The target composed of the metal mixture, a compound or alloy of the metals can be sputtered in an inert, reactive or inert-reactive gas mix, such as argon, $O_2$, $N_2$ or combinations.

Example 2

Ti—Al Oxide and Nitride Films Sputtered from Ti-50Al and Ti-30Al Alloy Targets

Alloys of Ti—Al oxide and nitride thin films coatings have shown surprising results in Cleveland Condensation Chamber (CCC) testing (Q-T-C Cleveland Condensation Tester is manufactured by The Q-Panel Company of Cleveland, Ohio). In comparison, aluminum oxide and nitride coatings sputtered at room temperature are completely removed in an hour or less when exposed in the CCC test chamber. Titanium dioxide (U.S. Pat. Nos. 4,716,086 and 4,786,563), nitride and oxynitrides, on the other hand, have good chemical durability and withstand days of exposure in the CCC test chamber before deteriorating. It was discovered that alloys of Ti—Al oxide and nitride thin films far surpass the performance of titanium dioxide in the CCC test chamber.

The coatings were deposited in an Airco ILS 1600 coater on 12"×12" (30 cm×30 cm) square by 2.3 mm thick clear float glass substrates at ambient temperature. The substrate was conveyed at a line speed of the 120 inches per minute. The base pressure was in the low $10^{-5}$ torr range and the operating pressure was 4 microns (m torr). The substrate was at ambient temperature during deposition. Planar targets of Ti-30Al and Ti-50Al, where the amount of aluminum is expressed in atomic percent, were manufactured (except where noted) by Hot Isostatic Pressing (HIP) powders of the alloy. The alloy oxide films were deposited in an atmosphere of 50% argon and 50% oxygen.

Sample E1

A Ti-50Al oxide sample was run at a power setting of 3.0 kilowatts, with a voltage of 432 volts and a current of 6.98 amps. After 10 passes, the transmission was 91.2% and the thickness was 114 Angstroms.

Sample E2

A second Ti-50Al oxide sample was run at a power setting of 4.0 kilowatts with a voltage of 494 volts and current 8.14 amps. The transmission was 87.5% after 10 passes and the thickness was 274 Angstroms.

Sample E3

A Ti-30Al oxide sample was run a power setting of 3.0 kilowatts with a voltage 490 volts, and the current of 6.14 amps. The transmission was 91.3% after 10 passes and the thickness was 89 Angstroms.

Sample E4

A Ti-50Al nitride sample was run in an atmosphere of 100% nitrogen at a power setting of 3.0 kilowatts with a voltage of 640 volts and a current of 4.72 amps. The transmission was 30.5% after 15 passes and the thickness was 713 Angstroms.

Comparative Sample CE1

The titanium dioxide sample, shown for comparison, was run at a power setting of 4.0 kilowatts with a voltage 451 volts, and a current of 8.86 amps. The transmission was 88.2% after 10 passes and the thickness was 92 Angstroms.

Table C summarizes the target material, coater setting and resulting coating.

Cleveland Condensation Chamber (CCC) Exposure Test Results for Samples E1 to E4 and CE1

The Ti-30Al and 50 Al oxide thin films showed no deterioration after weeks of exposure in the CCC test chamber. This was an unexpected result for these alloy oxides, considering the poor behavior of aluminum oxide in the CCC test; it would be expected that the addition of aluminum oxide would decrease the corrosion resistance of the alloy. Rather, the presence of aluminum enhances the corrosion resistance over that of titanium oxide. Longer term testing of the alloy oxides shows that the Ti-50Al oxide is even more corrosion resistant than the Ti-30 Al oxide. This is an even more surprising result given the higher concentration of aluminum in the coating.

Figure 4:
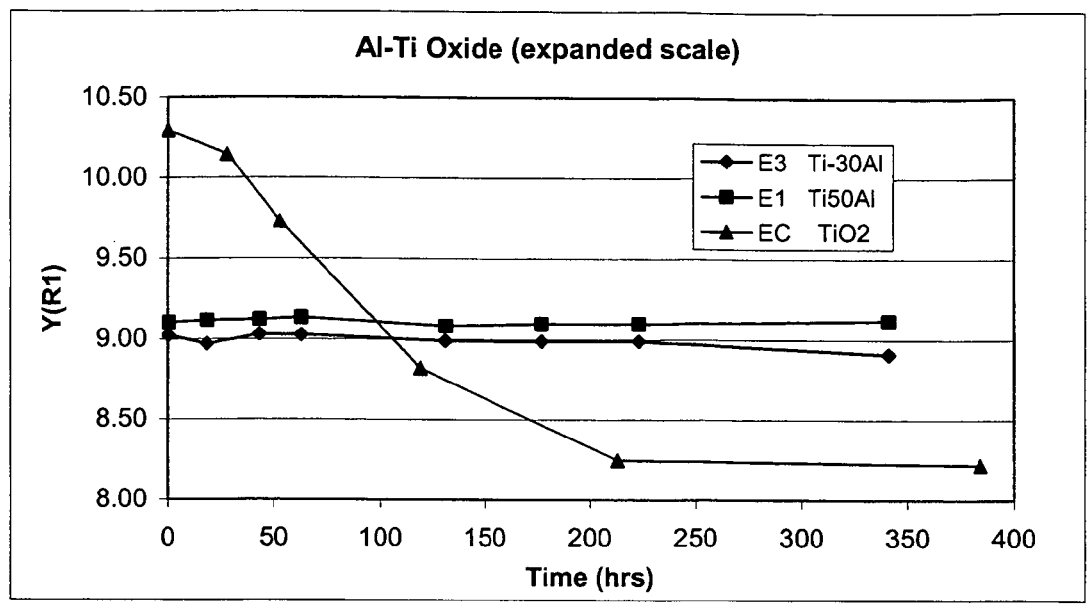
FIGS. 4 and 5 are graphs of reflectance versus time for coated articles of the invention.
Figure 5:
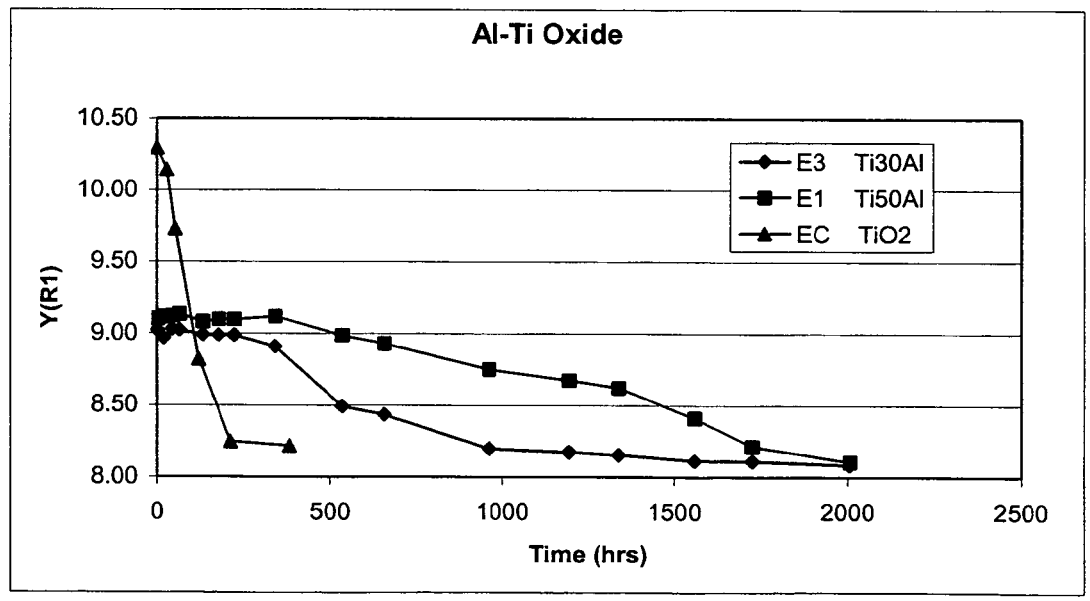
Figure 6:
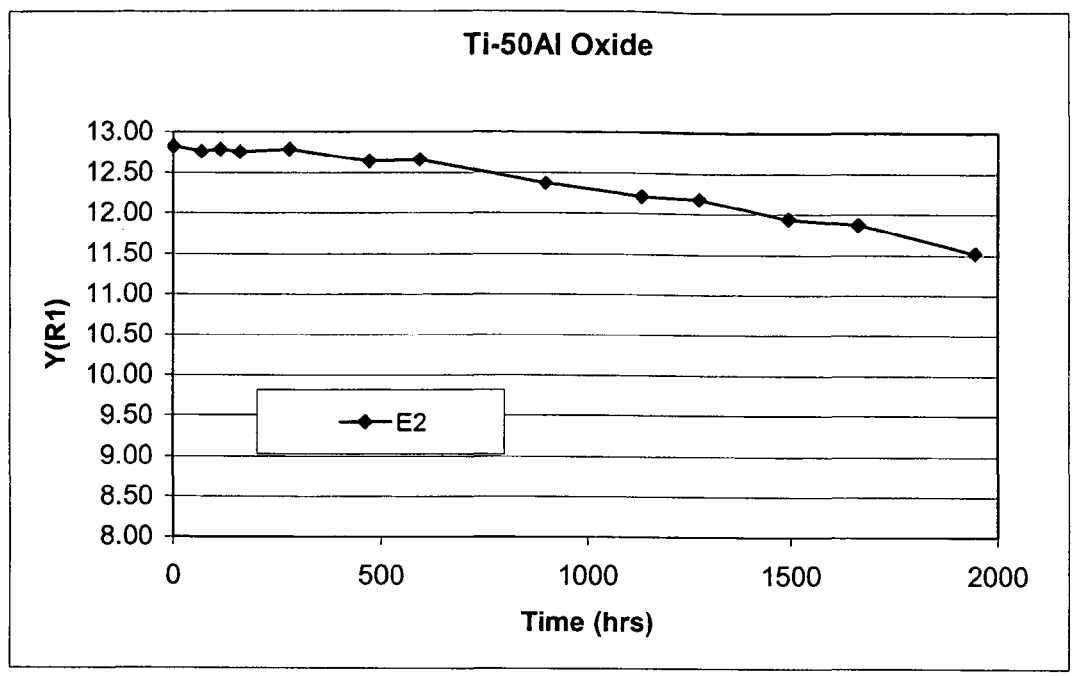
FIG. 6 is a graph of reflectance versus time for a coated article of the invention.

FIG. 4 (which is the same as FIG. 5 but with an expanded scale) shows the change in integrated reflectance (Y(R1)) of the coated surface as a function of exposure time in hours in the CCC. The TiO$_2$ film is shown for comparison. After at least 350 hours of exposure there is no significant change in the coating reflectance. The TiO2 shows a small change after 28 hours followed by a rapid decrease in reflectance indicating rapid coating degradation. After 200 hours, the coating is around 8%, which is the reflectance of the uncoated glass substrate. This indicates that the coating has been completely removed. FIGS. 4 and 5 show long-term behavior of the Ti—Al oxide coatings in the CCC test chamber. The Ti-50 Al oxide coating shows a slower decrease in reflectance than the Ti-30 Al oxide coating indicating slower degradation of the coating. As noted earlier, this is surprising considering the higher amount of aluminum in the coating. FIG. 6 shows the 274 Angstrom Ti-50 Al oxide coating. The behavior is similar to the thinner film with a slow, rather than rapid decrease in reflectance, as shown by TiO2 film.

Figure 7:
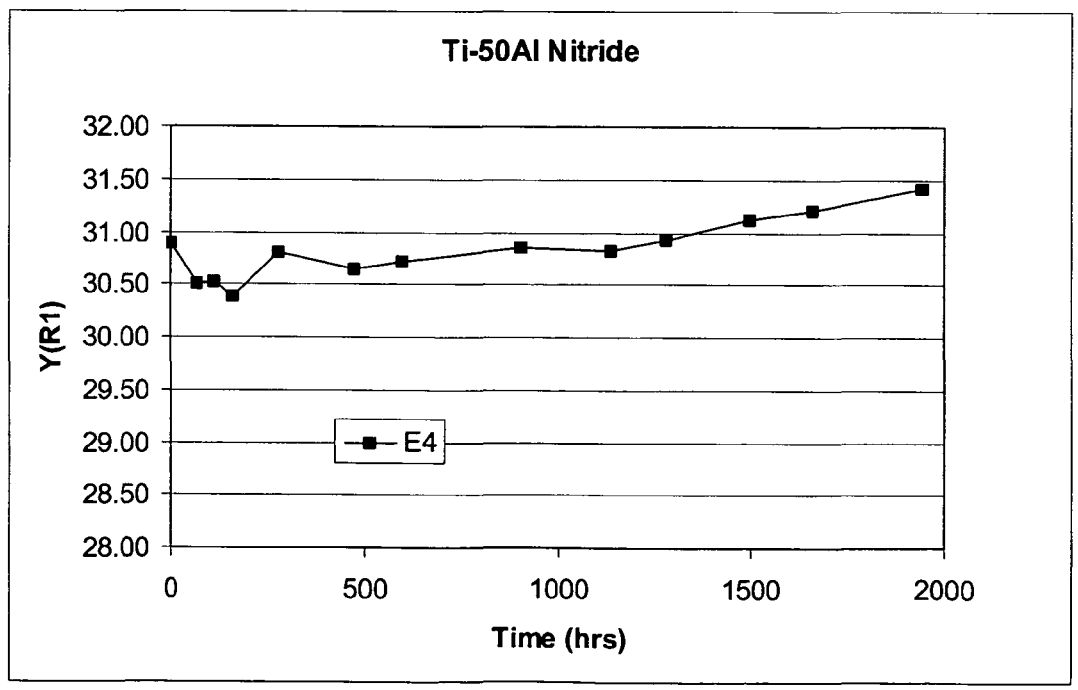
FIG. 7 is a graph of reflectance versus time for a coated article of the invention.

A Ti-50 Al nitride thin film has shown similar or better results in CCC test chamber exposure. Again, this is surprising considering the high susceptibility of aluminum nitride to water corrosion. FIG. 7 shows the Integrated Reflectance (Y(R1)) from the coated surface as a function of the exposure time in hours in the CCC chamber. There is less than a 1% change in reflectance after almost 2000 hours of exposure. Visual inspection of the Ti-50 Al nitride film showed no noticeable degradation as compared to the unexposed section of the coating.

TABLE C

| Sample No. | Target Alloy | ILS Coater Settings | | | | | Thickness (Å) | XRF (ug/cm$^2$) | | Wt % | |
|---|---|---|---|---|---|---|---|---|---|---|---|
| | | KW | Pass | Volts | Amps | ILS % T | Gas | | Al | Ti | Al | Ti |
| E1 | Ti—50Al | 3.0 | 10 | 432 | 6.98 | 91.2 | 50% O2—Ar | 114 | .58 | 1.19 | 33.9 | 66.1 |
| E2 | Ti—50Al | 4.0 | 20 | 494 | 8.14 | 87.5 | 50% O2—Ar | 274 | | | | |
| E3 | Ti—30Al | 3.0 | 10 | 490 | 6.14 | 91.3 | 50% O2—Ar | 89 | .26 | 1.19 | 18.7 | 81.3 |
| E4 | Ti—50Al | 3.0 | 15 | 640 | 4.72 | 30.5 | 100% N2 | 713 | | | | |
| CE1 | Ti | 4.0 | 10 | 451 | 8.86 | 88.2 | 50% O2—Ar | 92 | .00 | 1.89 | 0.0 | 100 |

Example 3

Ti—Al Oxide Films Sputtered from Ti-90 Al and Ti-10 Al Alloy Targets

Ti—Al metal films were deposited in an Airco ILS 1600 coater on 12"×12" (30 cm×30 cm) square by 2.3 mm thick clear float glass substrates at ambient temperature. The substrate was conveyed at a line speed of 120 inches (300 cm) per minute. The base pressure was in the low $10^{-6}$ torr range and the operating pressure was 4 microns. Planar targets of Ti-10 Al and Ti-90 Al, where the amount of aluminum is expressed in atomic percent, were used to deposit the coatings. The Ti-10 Al target was manufactured by Hot Isostatic Pressing (HIP) the alloy powder. Analysis of the target material indicated 5.85 weight percent aluminum with the balance titanium. The Ti-90 Al target was manufactured by vacuum induction skull melting and casting an ingot target from the metal powders. Analysis of the target material indicated 16.3 weight percent titanium with the balance aluminum. The alloy films were deposited in an atmosphere of 80% argon and 20% oxygen gas mixture.

Sample E6

A Ti-90 Al metal film sample was run at a power setting of 4 kilowatts, with a voltage of 419 volts and a current of 9.5 amps. The transmission was 90.1% after 10 passes under the target and the thickness was measured at 166 Angstroms.

Sample E7

A Ti-90 Al metal film sample was run at a power setting of 4.0 kilowatts, with a voltage of 404 volts and a current of 9.5 amps. The transmission was 88.7% after 20 passes under the target and the thickness was measured at 365 Angstroms.

Sample E8

A Ti-90 Al metal film sample was run at a power setting of 4 kilowatts, with a voltage of 400 volts and a current of 9.95 amps. The transmission was 87.1% after 30 passes under the target and the thickness was measured at 583 Angstroms.

Sample E9

A Ti-10 Al metal film sample was run at a power setting of 4 kilowatts, with a voltage of 534 volts and a current of 7.45 amps. The transmission was 88.0% after 10 passes under the target and the thickness was measured at 135 Angstroms.

Sample E10

A Ti-10 Al metal film sample was run at a power setting of 4.0 kilowatts, with a voltage of 536 volts and a current of 7.4 amps. The transmission was 81.5% after 20 passes under the target and the thickness was measured at 278 Angstroms.

Sample E11

A Ti-10 Al metal film sample was run at a power setting of 4.0 kilowatts, with a voltage of 532 volts and a current of 7.45 amps. The transmission was 75.2% after 30 passes under the target and the thickness was measured at 407 Angstroms.

Table D summarizes the target material, coater settings, and resulting coating.

Table E illustrates the sputtering rate for various combinations of target material (based on the atomic percentage of each component) in terms of Angstroms per kilowatt-pass.

Figure 8:
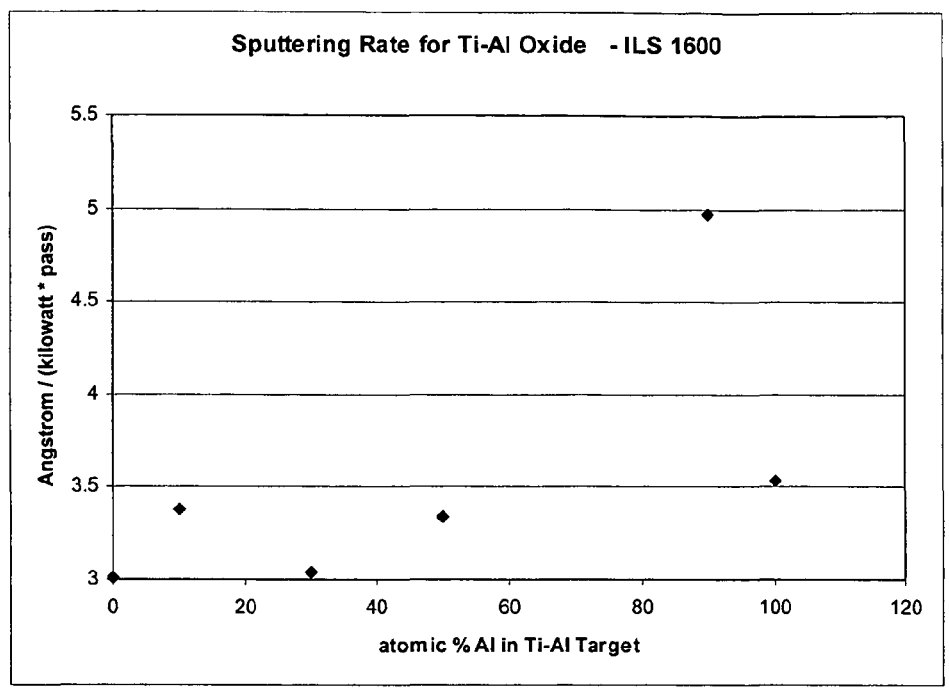
FIG. 8 is a graph of thickness versus atomic percent aluminum for a coating of the invention.

FIG. 8 plots the sputtering rate for the different targets shown in Table E.

TABLE D

| Sample No. | Target Alloy | ILS Coater Settings | | | | | Thickness (Å) | XRF ($ug/cm^2$) | | Wt % | |
|---|---|---|---|---|---|---|---|---|---|---|---|
| | | KW | Pass | Volts | Amps | ILS % T | Gas | | Al | Ti | Al | Ti |
| E6 | Ti—90Al | 4 | 10 | 419 | 9.5 | 90.1 | 80% $O_2$/Ar | 166 | 1.84 | 0.44 | 80.7% | 19.3% |
| E7 | Ti—90Al | 4 | 20 | 404 | 9.5 | 88.7 | 80% $O_2$/Ar | 365 | 3.73 | 0.87 | 81.1% | 18.9% |
| E8 | Ti—90Al | 4 | 30 | 400 | 9.95 | 87.1 | 80% $O_2$/Ar | 583 | 5.75 | 1.28 | 81.8% | 18.2% |
| E9 | Ti—10Al | 4 | 10 | 534 | 7.45 | 88 | 80% $O_2$/Ar | 135 | 0.15 | 2.34 | 6.0% | 94.0% |
| E10 | Ti—10Al | 4 | 20 | 536 | 7.4 | 81.5 | 80% $O_2$/Ar | 278 | 0.29 | 4.96 | 5.5% | 94.5% |
| E11 | Ti—10Al | 4 | 30 | 532 | 7.45 | 75.2 | 80% $O_2$/Ar | 407 | 0.41 | 7.28 | 5.3% | 94.7% |

TABLE E

Sputtering Rate (Angstroms per kilowatt-pass) for Ti—Al Oxide Coatings
Ti—Al target in 80% O2/Ar Gas mixture

| Sample No. | Target material | Press μ | no. pass | kw | kw * pass (kwp) | Voltage (volts) | Current (amps) | ILS % T | Thickness (Å) | Avg. wt % Al | Å/kwp (Least sq fit) | $R^2$ |
|---|---|---|---|---|---|---|---|---|---|---|---|---|
| CE2 | Al | 4 | 120 | 1 | 120 | 283 | 3.44 | 89.4 | 422 | | | |
| CE3 | Al | 4 | 80 | 1 | 80 | 289 | 3.36 | 89.5 | 284 | | | |
| CE4 | Al | 4 | 40 | 1 | 40 | 285 | 3.48 | 89.9 | 146 | 0.00 | 3.54 | 0.999 |
| CE5 | Ti | 4 | 30 | 4 | 120 | 493 | 8.06 | 74.6 | 358 | | | |
| CE6 | Ti | 4 | 20 | 4 | 80 | 490 | 7.94 | 82.5 | 239 | | | |
| CE7 | Ti | 4 | 10 | 4 | 40 | 506 | 7.9 | 88.2 | 136 | 1.00 | 3.01 | 0.990 |
| E11 | Ti—10Al | 4 | 30 | 4 | 120 | 532 | 7.45 | 75.2 | 407 | | | |
| E10 | Ti—10Al | 4 | 20 | 4 | 80 | 536 | 7.4 | 81.5 | 278 | | | |
| E9 | Ti—10Al | 4 | 10 | 4 | 40 | 534 | 7.45 | 88 | 135 | | | |
| E12 | Ti—10Al | 4 | 30 | 4 | 120 | 514 | 7.6 | 74 | 396 | | | |
| E13 | Ti—10Al | 4 | 20 | 4 | 80 | 539 | 7.36 | 81.8 | 274 | | | |
| E14 | Ti—10Al | 4 | 10 | 4 | 40 | 548 | 7.27 | 88 | 121 | | | |
| E15 | Ti—10Al | 4 | 5 | 4 | 20 | 545 | 7.31 | 89.5 | 101 | 0.06 | 3.38 | 0.985 |
| E16 | Ti—30Al | 4 | 30 | 4 | 120 | 509 | 7.8 | 81.2 | 358 | | | |
| E17 | Ti—30Al | 4 | 20 | 4 | 80 | 544 | 7.3 | 85.9 | 210 | | | |
| E18 | Ti—30Al | 4 | 10 | 4 | 40 | 553 | 7.2 | 88.9 | 123 | | | |
| E19 | Ti—30Al | 4 | 30 | 4 | 120 | 601 | 6.66 | 80.7 | 379 | | | |
| E20 | Ti—30Al | 4 | 20 | 4 | 80 | 602 | 6.65 | 85.2 | 256 | | | |
| E21 | Ti—30Al | 4 | 10 | 4 | 40 | 603 | 6.63 | 88.9 | 141 | 0.17 | 3.04 | 0.967 |
| E22 | Ti—50Al | 5 | 30 | 4 | 120 | 423 | 9.42 | 84.2 | 384 | | | |
| E23 | Ti—50Al | 5 | 20 | 4 | 80 | 460 | 8.65 | 87.5 | 258 | | | |
| E24 | Ti—50Al | 5 | 10 | 4 | 40 | 459 | 8.67 | 89.5 | 91 | | | |
| E25 | Ti—50Al | 4 | 30 | 4 | 120 | 460 | 8.73 | 83.6 | 409 | | | |
| E26 | Ti—50Al | 4 | 20 | 4 | 80 | 479 | 8.35 | 86.4 | 314 | | | |
| E27 | Ti—50Al | 4 | 10 | 4 | 40 | 477 | 8.36 | 89.1 | 128 | 0.33 | 3.34 | 0.948 |
| E8 | Ti—90Al | 4 | 30 | 4 | 120 | 400 | 9.95 | 87.1 | 583 | | | |
| E7 | Ti—90Al | 4 | 20 | 4 | 80 | 404 | 9.5 | 88.7 | 365 | | | |
| E6 | Ti—90Al | 4 | 10 | 4 | 40 | 419 | 9.5 | 90.1 | 166 | | | |
| E28 | Ti—90Al | 4 | 30 | 4 | 120 | 392 | 9.65 | 86.8 | 600 | | | |
| E29 | Ti—90Al | 4 | 20 | 4 | 80 | 395 | 9.71 | 86 | 452 | | | |
| E30 | Ti—90Al | 4 | 10 | 4 | 40 | 408 | 9.56 | 88.4 | 210 | 0.80 | 4.96 | 0.967 |

Example 4

Ti—Al Metal Films Sputtered from Ti—Al Metal Targets

Ti—Al metal films were deposited in an Airco ILS 1600 coater on 12"×12" (30 cm×30 cm) square by 2.3 mm thick clear float glass substrates at ambient temperature. The substrate was conveyed at a line speed of 120 inches per minute. The base pressure was in the low $10^{-5}$ torr range and the operating pressure was 4 microns. Planar targets of Ti-30 Al and Ti-50 Al, where the amount of aluminum is expressed in atomic percent, were manufactured by Hot Isostatic Pressing (HIP) powers of the alloy powder. A planar target of Ti-90 Al, where the amount of aluminum is expressed in atomic percent, was made by Vacuum Induction skull Melting (VIM) and casting an ingot target from the metal powders. The alloy films were deposited in an atmosphere of 100% argon gas.

Sample D1

A Ti-30 Al metal film sample was run at a power setting of 3.0 kilowatts, with a voltage of 529 volts and a current of 5.72 amps. The transmission was 21.3% after 1 pass under the target and the thickness was measured at 161 Angstroms.

Sample D2

A Ti-30 Al metal film sample was run at a power setting of 3.0 kilowatts, with a voltage of 529 volts and a current of 5.7 amps. The transmission was 8.5% after 2 passes under the target and the thickness was measured at 270 Angstroms.

Sample D3

A Ti-30 Al metal film sample was run at a power setting of 3.0 kilowatts, with a voltage of 529 volts and a current of 5.72 amps. The transmission was 0% after 5 passes under the target and the thickness was measured at 704 Angstroms.

Sample D4

A Ti-30 Al metal film sample was run at a power setting of 3.0 kilowatts, with a voltage of 528 volts and a current of 5.70 amps. The transmission was 0% after 10 passes under the target and the thickness was measured at 1306 Angstroms.

Sample D5

A Ti-50 Al metal film sample was run at a power setting of 3.0 kilowatts, with a voltage of 610 volts and a current of 4.94 amps. The transmission was 19.1% after 1 pass under the target and the thickness was measured at 169 Angstroms.

Sample D6

A Ti-50 Al metal film sample was run at a power setting of 3.0 kilowatts, with a voltage of 609 volts and a current of 4.96 amps. The transmission was 7.4% after 2 passes under the target and the thickness was measured at 312 Angstroms.

Sample D7

A Ti-50 Al metal film sample was run at a power setting of 3.0 kilowatts, with a voltage of 605 volts and a current of 5.0 amps. The transmission was 0% after 5 passes under the target and the thickness was measured at 756 Angstroms.

Sample D8

A Ti-50 Al metal film sample was run at a power setting of 3.0 kilowatts, with a voltage of 603 volts and a current of 5.0 amps. The transmission was 0% after 10 passes under the target and the thickness was measured at 1500 Angstroms.

Sample D9

A Ti-90 Al metal film was deposited at a power setting of 3.0 kilowatts, with a voltage of 827 volts and a current of 3.18 amps. The transmission was 8.8% after 1 pass under the target and the thickness was measured at 162 Angstroms.

Sample D10

A Ti-90 Al metal film was deposited at a power setting of 3.0 kilowatts, with a voltage of 827 volts and a current of 3.13 amps. The transmission was 2.1% after 1 pass under the target and the thickness was measured at 311 Angstroms.

Sample D11

A Ti-90 Al metal film was deposited at a power setting of 3.0 kilowatts, with a voltage of 827 volts and a current of 3.15 amps. The transmission was 0.0% after 1 pass under the target and the thickness was measured at 756 Angstroms.

Sample D12

A Ti-90 Al metal film was deposited at a power setting of 3.0 kilowatts, with a voltage of 827 volts and a current of 1.13 amps. The transmission was 0.0% after 1 pass under the target and the thickness was measured at 1505 Angstroms.

Table F summarizes the target material, coater settings, and resulting coating.

TABLE F

| Sample No. | Target Alloy | ILS Coater Settings | | | | | Thickness (Å) | Microgm/cm² | | Wt % | |
|---|---|---|---|---|---|---|---|---|---|---|---|
| | | KW | Pass | Voltage | Current | ILS % T | Gas | | Al | Ti | Al | Ti |
| D1 | Ti30Al | 3.0 | 1 | 529 | 5.72 | 21.3 | Ar | 161 | 0.88 | 4.13 | 17.3 | 82.7 |
| D2 | Ti30Al | 3.0 | 2 | 529 | 5.70 | 8.5 | Ar | 270 | 1.76 | 8.48 | 17.1 | 82.9 |
| D3 | Ti30Al | 3.0 | 5 | 529 | 5.72 | 0.0 | Ar | 704 | 4.31 | 21.31 | 16.8 | 83.2 |
| D4 | Ti30Al | 3.0 | 10 | 528 | 5.70 | 0.0 | Ar | 1306 | 8.24 | 42.29 | 16.3 | 83.7 |
| D5 | Ti50Al | 3.0 | 1 | 610 | 4.94 | 19.1 | Ar | 169 | 1.81 | 3.56 | 33.6 | 66.4 |
| D6 | Ti50Al | 3.0 | 2 | 609 | 4.96 | 7.4 | Ar | 312 | 3.49 | 6.83 | 33.8 | 66.2 |
| D7 | Ti50Al | 3.0 | 5 | 605 | 5.00 | 0.0 | Ar | 756 | 8.66 | 17.80 | 32.7 | 67.3 |
| D8 | Ti50Al | 3.0 | 10 | 603 | 5.00 | 0.0 | Ar | 1500 | 16.58 | 35.17 | 32.0 | 68.0 |
| D9 | Ti—90Al | 3.0 | 1 | 827 | 3.18 | 8.8 | Ar | 162 | 3.26 | 0.87 | 78.9 | 21.1 |
| D10 | Ti—90Al | 3.0 | 2 | 827 | 3.13 | 2.1 | Ar | 311 | 6.44 | 1.69 | 79.2 | 20.8 |
| D11 | Ti—90Al | 3.0 | 5 | 827 | 3.15 | 0.0 | Ar | 756 | 15.99 | 4.13 | 79.5 | 20.5 |
| D12 | Ti—90Al | 3.0 | 10 | 827 | 3.13 | 0.0 | Ar | 1505 | 31.02 | 7.85 | 79.8 | 20.2 |

Example 5

Ti—Al Primer Layers Sputtered from Al and Ti Split Target

Sample G3

A 12×12 inch (30 cm×30 cm) soda-lime glass substrate was placed in an Airco ILS coater with a base pressure of 1.1×10-5 torr. The layer sequence for the low emissivity coating was:

Glass/zinc stannate/Al—Ti primer/silver/Al—Ti primer/zinc stannate.

The first layer of an alloy of zinc and tin of 48% tin and 52% zinc by weight was deposited at 4 microns pressure in an atmosphere of 50%/50% mix by flow of argon and oxygen. The power to the cathode target was set at 1.7 kilowatts resulting in a voltage of 395 volts and a current of 4.30 amps. The glass was passed under the cathode 4 times until the transmission reached 81.9%. The second layer was deposited using the gradient cathode described earlier. The pressure in the chamber was 3 microns in a 100% argon gas atmosphere. The power to the cathode was set at 0.4 kilowatts, resulting in a voltage of 348 volts and a current of 1.14 amps. The glass was passed under the cathode 1 time, resulting in a transmission of 66.7%. The third layer was deposited using a silver cathode. The pressure in the chamber was 3 microns in a 100% argon gas atmosphere. The power to the cathode was set at 0.6 kilowatts, resulting in a voltage of 394 volts and a current of 1.52 amps. The glass was passed under the cathode 1 time, which resulted in a transmission of 50.9%. The fourth layer was deposited under the same conditions as the second layer. The transmission after this layer was 41.0%. The fifth and final layer was deposited under the same conditions as the first layer. The final transmission was 72.0%. The conveyor speed was 120 inches per minute. The coating was then heated to above the bending point of glass.

The sample was kept in the open environment of the lab for more than 1.5 years and then reevaluated. It was found that a coating had broken down in a pattern that followed the Ti/Al gradient as shown in Table B and FIG. 3. The aluminum end of the sample showed large areas of coating that had completely broken down; the titanium end showed spotty areas of coating breakdown, typical of coating that has been in a unprotected environment for an extended period of time. Surprisingly, there was an area of the coating that clearly showed no breakdown in the region where aluminum and titanium were mixed. Since the sheet resistance of the coating tends to increase as the coating degrades, measurements were made along the gradient of the coating. Although the resistance values were not made initially, the lower values of the sheet resistance corresponded to the section of the coating that showed no breakdown over the time period.

Figure 9:
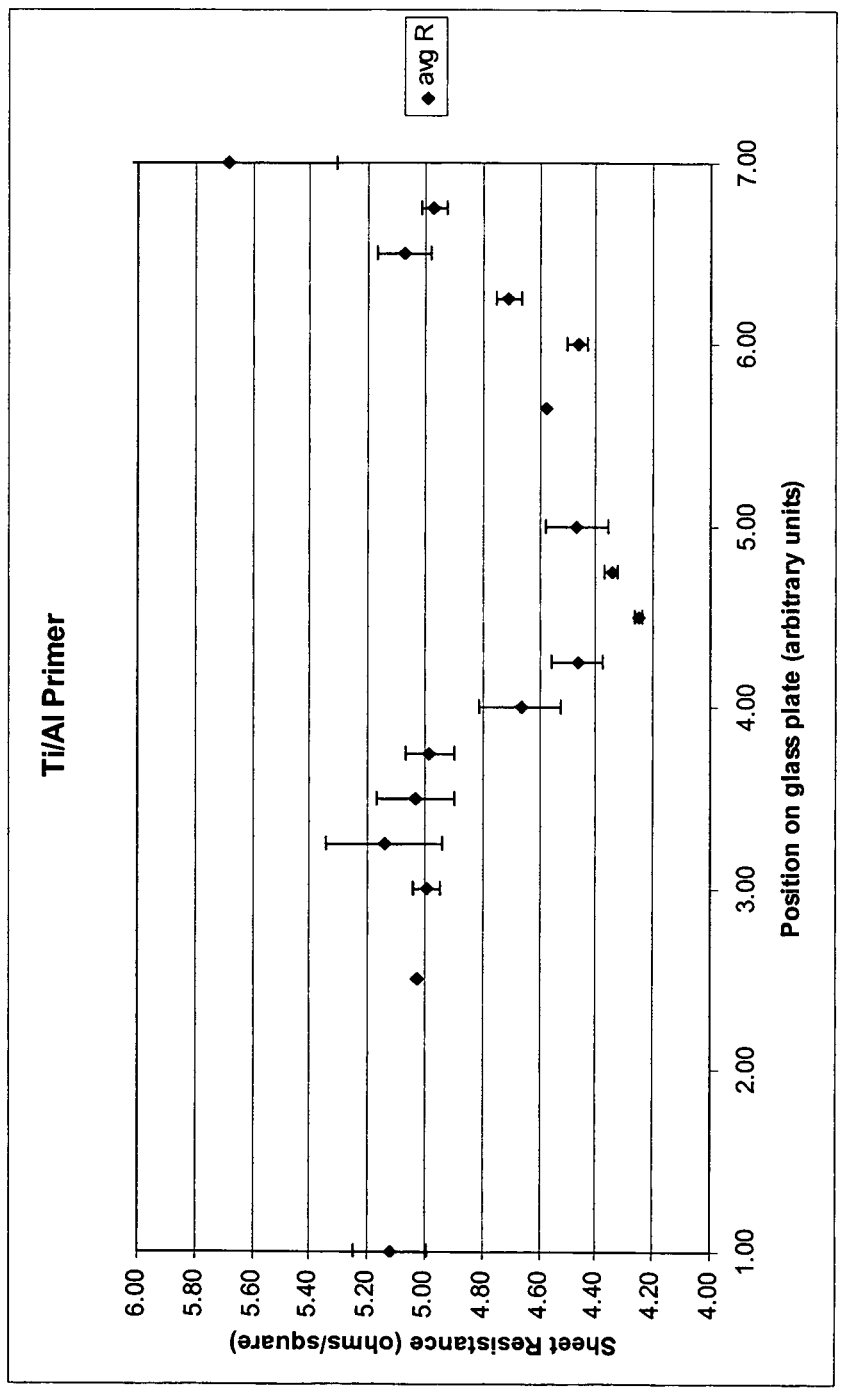
FIG. 9 is a graph of sheet resistance versus position for a coated glassy plate.

All areas measured were selected along the width of the sample from regions where the coating had not yet broken down. An Allessi 4-point probe was used with a Kiethley System digital multimeter to make the sheet resistance measurements. Where possible, several measurements were made at each location along the gradient and the standard deviation was calculated. In some locations where there was a large amount of breakdown only one measurement was possible. The calibrated template was used to determine the percentage of titanium and aluminum at each point along the width of the sample where the sheet resistance measurements were made. The sheet resistance for the low emissivity coating for each position along the template is shown in FIG. 9. The error bars denote +/− one standard deviation.

Figure 3:
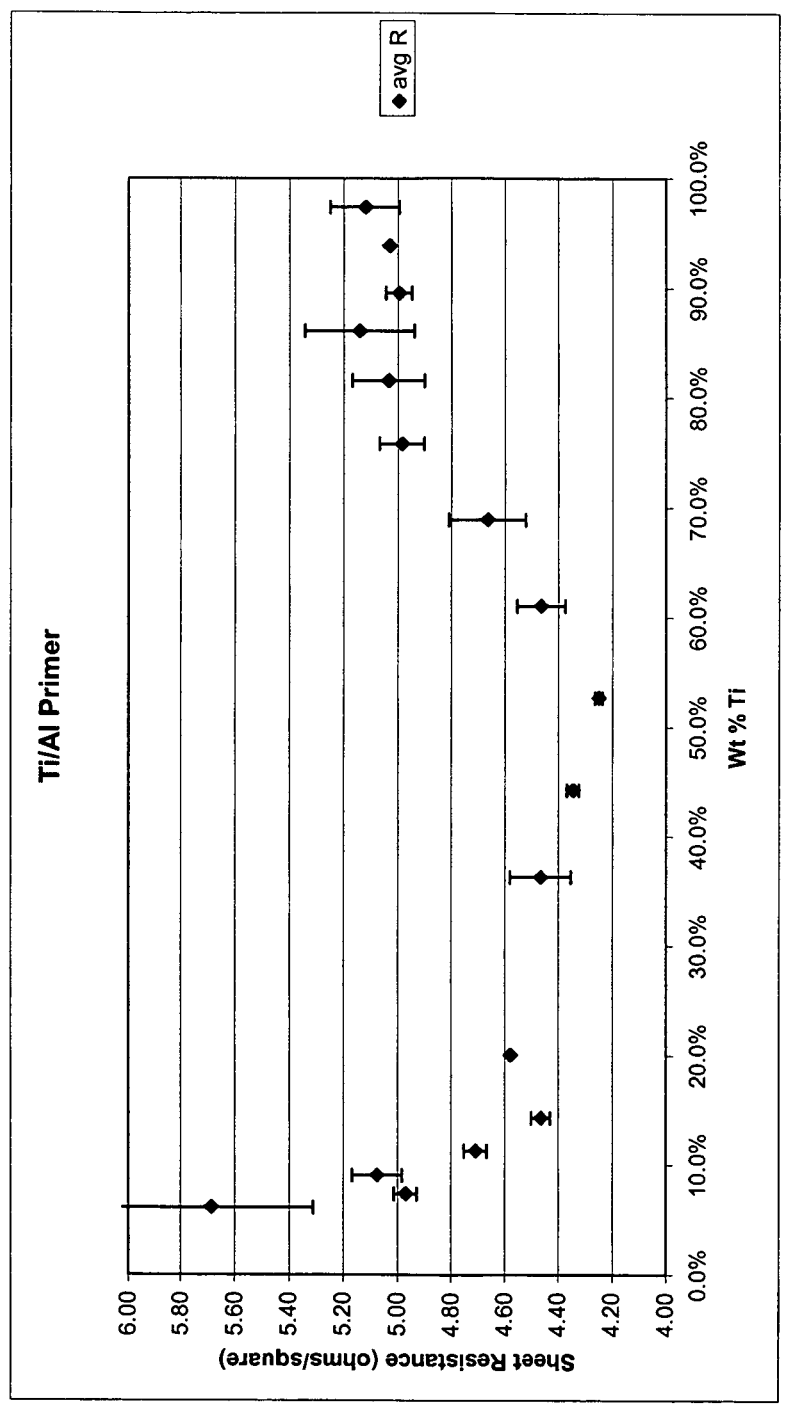
FIG. 3 is a graph of sheet resistance versus weight percent titania for a coated article incorporating features of the invention.
Figure 10:
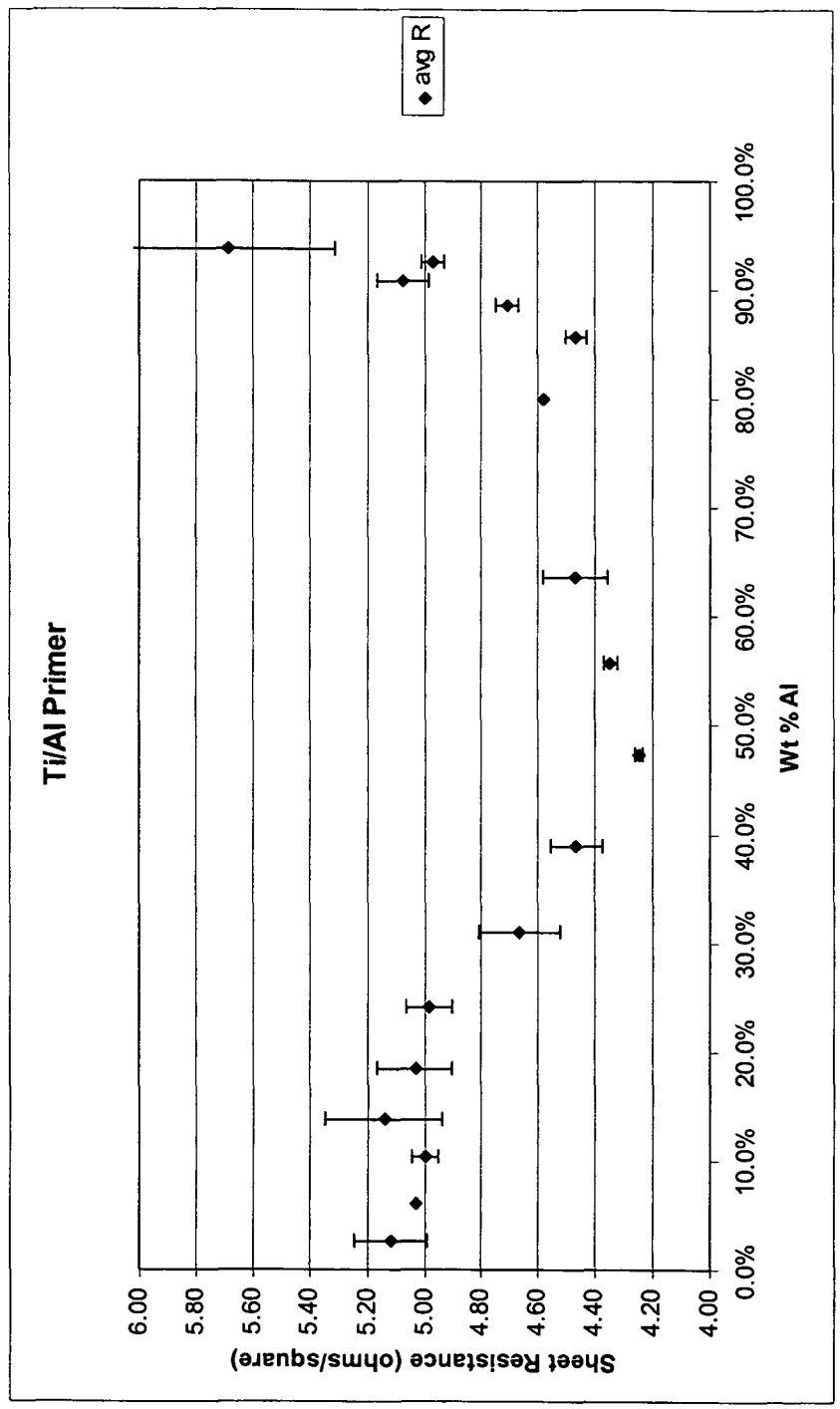
FIG. 10 is a graph of sheet resistance versus weight percent aluminu for a coated article of the invention.
Figure 11:
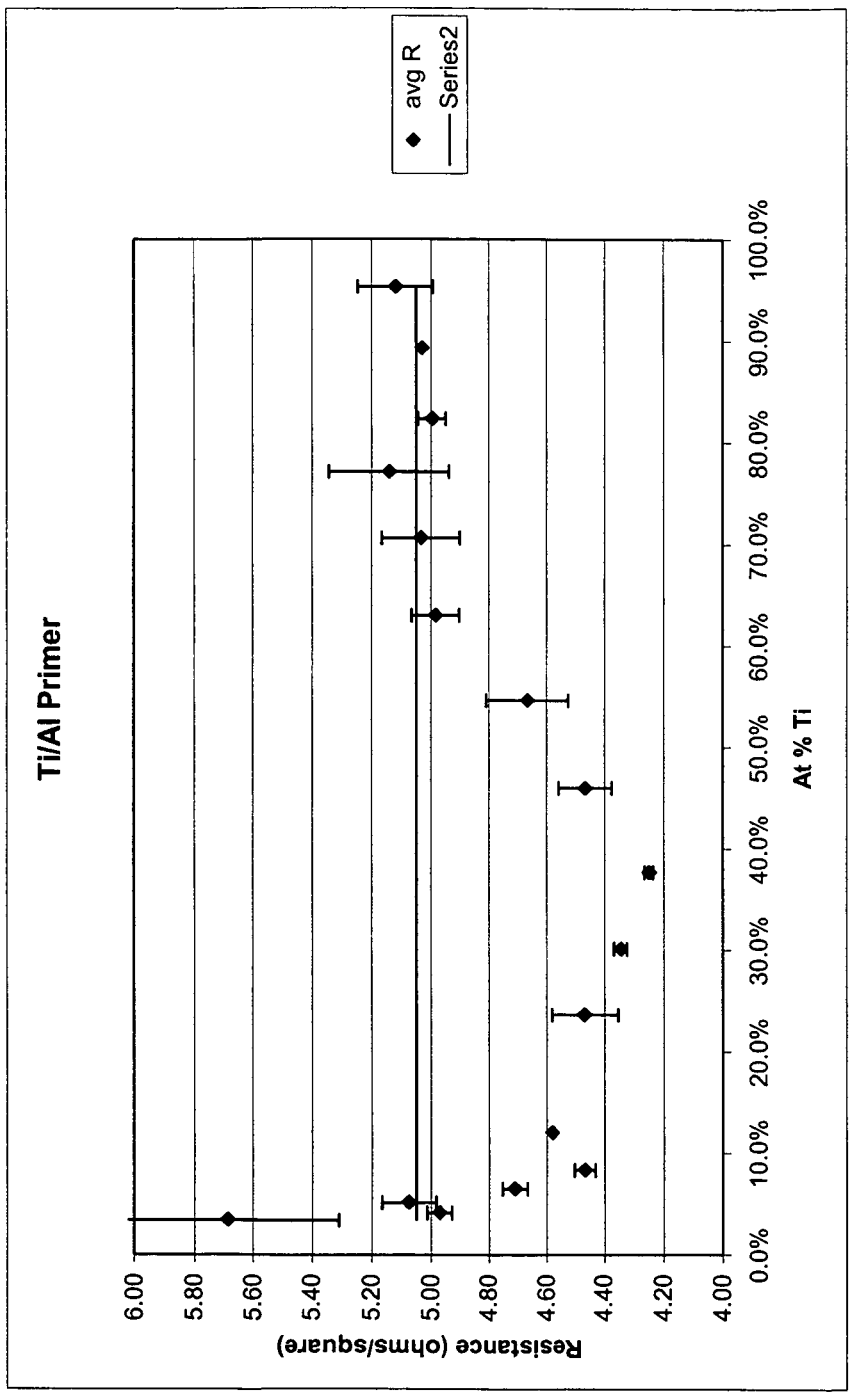
FIG. 11 is a graph of sheet resistance versus atomic percent titanium for a coating of the invention.
Figure 12:
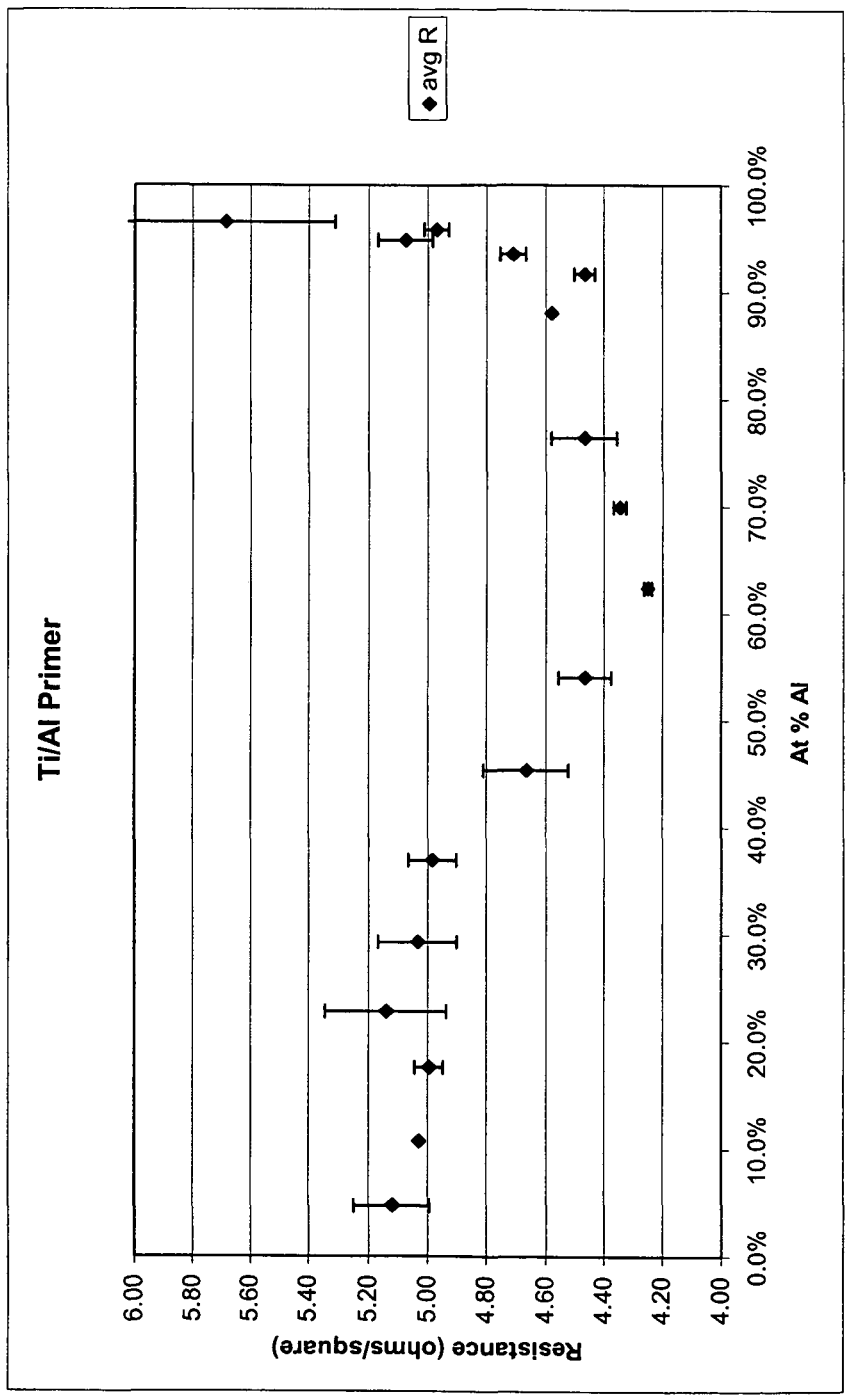
FIG. 12 is a graph of sheet resistance versus atomic percent aluminum for a coating of the invention.

FIGS. 3 and 10 show the sheet resistance as a function of the weight percentage of titanium and aluminum, respectively, in the primer layers of the low emissivity coating. The graph shows that for values of wt % titanium greater than 10% and less than 80% the resistance of the coating is lower than the pure metal or low percentage mixture. There is a steep rise in resistance for coatings less than 10% aluminum indicating that the aluminum primer, even after heating, is unstable after exposure in an unprotected environment. For values of titanium greater than 80% there is a leveling off in the value of the resistance, indicating that typical behavior of coatings common in the art today. The coating in the range of 10 to 80 weight percent titanium, with the balance of aluminum, not only has lower sheet resistance but also has increased stability when left unprotected. The corresponding atomic weights are shown in FIGS. 11 and 12.

Example 6

Ti—Al Primer Layers Sputtered from Ti-50 Al and Ti-30 Al Alloy Targets

Primer layers using Ti—Al alloy targets were used to make samples of low emissivity coatings with the coating the layer sequence:

Glass/zinc stannate/silver/Al—Ti/zinc stannate.

The coating configuration differs from the gradient target configuration (sample G3) with the omission of the alloy layer below the silver layer. The following examples illustrate the functionality of the alloy layer compared to a titanium layer, which is used in the art. (U.S. Pat. Nos. 4,898,789 and 4,898,790)

The planar targets used for the primer layer above the silver were Ti-30 Al and Ti-50 Al, where the amount of aluminum is expressed in atomic percent, were manufactured by Hot Isostatic Pressing (HIP) powders of the alloy. Analysis of the Ti-30 Al target material indicated 19.19 weight percent aluminum with the balance titanium. Analysis of the Ti-50% target material indicated 36.48 weight percent aluminum with the balance titanium. A pure titanium target was used to produce primer samples for comparison with the alloy primers.

Sample B1

A 12 inch×12 inch (30 cm×30 xm) by 2.3 mm thick clear float glass substrate was placed in an Airco ILS coater with a base pressure in the low $10^{-5}$ Torr. The first layer of an alloy of zinc and tin of 48% tin and 52% zinc by weight was deposited at 4.0 microns pressure in an atmosphere of 80% argon gas and 20% oxygen gas mixture as set on the flow controller. The power to the cathode target was set at 2.2 kilowatts resulting in a voltage of 360 volts and a current of 6.12 amps. The glass was passed under the cathode 5 times at a conveyor speed of 120 inches per minute (3.05 meters per minute) until the transmission reached 81.2%. The thickness of the first layer was 312 Angstroms. The second layer was deposited using a silver cathode. The pressure in the chamber was 4.0 microns in a 100% argon gas atmosphere. The power to the cathode was set at 0.6 kilowatts, resulting in a voltage of 458 volts and a current of 1.32 amps. The glass was passed under the cathode 1 time, which resulted in a transmission of 64.2%. The thickness of the second layer was 111 Angstroms. The third layer was deposited using the Ti-30 Al target at a power setting of 0.3 kilowatts, with a voltage of 354 volts and a current of 0.86 amps. The thickness of the Ti—Al primer layer was calculated to be 13 Angstroms after 1 pass the transmission was 55.60%. The fourth and final layer was deposited under the same conditions as the first layer, resulting in a final transmission of the coating of 87.0%. The sheet resistance after coating was 5.96 ohms per square. The coated glass substrate was then heated for 5 minutes at 704° C. (1300° F.) resulting in a substrate temperature of 649° C. (1200° F.). The electrical sheet resistance was infinite and the transmittance was 77.4% after heating.

Sample B2

The first and fourth layer were deposited from the alloy target of zinc and tin, and the second layer of was deposited from the silver target by the same method of Sample B1. The third layer was deposited by passing the glass one time under the Ti-30 Al target at a power setting of 0.6 kilowatts, with a voltage of 390 volts and a current of 1.56 amps. The transmission was 47.1% after deposition of the third layer. The final transmittance of the coating after the deposition of the fourth layer was 79.6%. The sheet resistance after coating was 7.85 ohms per square. The coating was then heated by the method described for Sample B1. The transmittance was 82.9% and the electrical sheet resistance was 9.1 ohms per square after heating.

Sample B3

The first and fourth layer were deposited from the alloy target of zinc and tin, and the second layer of was deposited from the silver target by the same method of Sample B1. The third layer was deposited by passing the glass one time under the Ti-30 Al target at a power setting of 0.9 kilowatts, with a voltage of 410 volts and a current of 2.20 amps. The transmission was 40.3% after deposition of the third layer. The final transmittance of the coating after the deposition of the fourth layer was 68.5%. The sheet resistance after coating was 7.15 ohms per square. The coating was then heated by the method described above for Sample B1. The transmittance was 83.5% and the electrical sheet resistance was 6.6 ohms per square after heating.

Sample B4

The first and fourth layer were deposited from the alloy target of zinc and tin, and the second layer of was deposited from the silver target by the same method of Sample B1. The third layer was deposited by passing the glass one time under the Ti-30 Al target at a power setting of 1.2 kilowatts, with a voltage of 423 volts and a current of 2.84 amps. The transmission was 35.2% after deposition of the third layer. The final transmittance of the coating after the deposition of the fourth layer was 60.7%. The sheet resistance after coating was 7.66 ohms per square. The coating was then heated by the method described for Sample B1. The transmittance was 74.8% and the electrical sheet resistance was 8.40 ohms per square after heating.

Sample B5

The first and fourth layer were deposited from the alloy target of zinc and tin, and the second layer of was deposited from the silver target by the same method of example B1. The third layer was deposited by passing the glass one time under the Ti-50 Al target at a power setting of 0.3 kilowatts, with a voltage of 380 volts and a current of 0.82 amps. The transmission was 52.4% after deposition of the third layer. The final transmittance of the coating after the deposition of the fourth layer was 86.2%. The sheet resistance after coating was 6.97 ohms per square. The coating was then heated by the method described for Sample B1. The transmittance was 84.7% and the electrical sheet resistance was 13.6 ohms per square after heating.

Sample B6

The first and fourth layer were deposited from the alloy target of zinc and tin, and the second layer of was deposited from the silver target by the same method of Sample B1. The third layer was deposited by passing the glass one time under the Ti-50 Al target at a power setting of 0.6 kilowatts, with a voltage of 426 volts and a current of 1.42 amps. The transmission was 44.1% after deposition of the third layer. The final transmittance of the coating after the deposition of the fourth layer was 74.3%. The sheet resistance after coating was 8.46 ohms per square. The coating was then heated by the method described for Sample B1. The transmittance was 85.1% and the electrical sheet resistance was 6.9 ohms per square after heating.

Sample B7

The first and fourth layer were deposited from the alloy target of zinc and tin, and the second layer of was deposited from the silver target by the same method of Sample B1. The third layer was deposited by passing the glass one time under the Ti-50 Al target at a power setting of 0.9 kilowatts, with a voltage of 458 volts and a current of 1.98 amps. The transmission was 37.6 after deposition of the third layer. The final transmittance of the coating after the deposition of the fourth layer was 63.7%. The sheet resistance after coating was 8.20 ohms per square. The coating was then heated by the method described for Sample B1. The transmittance was 80.6% and the electrical sheet resistance was 8.9 ohms per square after heating.

Sample B8

The first and fourth layer were deposited from the alloy target of zinc and tin, and the second layer of was deposited from the silver target by the same method of Sample B1. The third layer was deposited by passing the glass one time under the Ti-50 Al target at a power setting of 1.2 kilowatts, with a voltage of 482 volts and a current of 2.52 amps. The transmission was 32.6% after deposition of the third layer. The final transmittance of the coating after the deposition of the fourth layer was 55.5%. The sheet resistance after coating was 8.08 ohms per square. The coating was then heated by the method described for Sample B1. The transmittance was 72.9% and the electrical sheet resistance was 13.1 ohms per square after heating.

Sample CB1

The first and fourth layer were deposited from the alloy target of zinc and tin, and the second layer of was deposited from the silver target by the same method of Sample B1. The third layer was deposited by passing the glass one time under the Ti target at a power setting of 0.3 kilowatts, with a voltage of 317 volts and a current of 0.96 amps. The transmission was 54.6 after deposition of the third layer. The final transmittance of the coating after the deposition of the fourth layer was 87.3%. The sheet resistance after coating was 6.36 ohms per square. The coating was then heated by the method described for Sample B1. The transmittance was 74.6% and the electrical sheet resistance was infinite after heating.

Sample CB2

The first and fourth layer were deposited from the alloy target of zinc and tin, and the second layer of was deposited from the silver target by the same method of Sample B1. The third layer was deposited by passing the glass one time under the Ti target at a power setting of 0.6 kilowatts, with a voltage of 340 volts and a current of 1.78 amps. The transmission was 46.6 after deposition of the third layer. The final transmittance of the coating after the deposition of the fourth layer was 80.1%. The sheet resistance after coating was 7.42 ohms per square. The coating was then heated by the method described for Sample B1. The transmittance was 82.3% and the electrical sheet resistance was 7.90 ohms per square after heating.

Sample CB3

The first and fourth layer were deposited from the alloy target of zinc and tin, and the second layer of was deposited from the silver target by the same method of Sample B1. The third layer was deposited by passing the glass one time under the Ti target at a power setting of 0.9 kilowatts, with a voltage of 354 volts and a current of 2.56 amps. The transmission was 39.5% after deposition of the third layer. The final transmittance of the coating after the deposition of the fourth layer was 68.8%. The sheet resistance after coating was 7.85 ohms per square. The coating was then heated by the method described for Sample B1. The transmittance was 79.7% and the electrical sheet resistance was 6.50 ohms per square after heating.

Sample CB4

The first and fourth layer were deposited from the alloy target of zinc and tin, and the second layer of was deposited from the silver target by the same method of Sample B1. The third layer was deposited by passing the glass one time under the Ti target at a power setting of 1.2 kilowatts, with a voltage of 364 volts and a current of 3.32 amps. The transmission was 33.9% after deposition of the third layer. The final transmittance of the coating after the deposition of the fourth layer was 59.6%. The sheet resistance after coating was 7.78 ohms per square. The coating was then heated by the method described for Sample B1. The transmittance was 74.0% and the electrical sheet resistance was 8.2 ohms per square after heating.

Table G summarized the target material, coater settings, and resulting coatings.

ous. The primer layers attain a minimum sheet resistance of 6.5 ohms per square, but the Ti-50 Al primer attains the minimum resistance at a lower thickness. All the primer layers sharply increase in electrical resistance beyond the minimum resistance.

Figure 15:
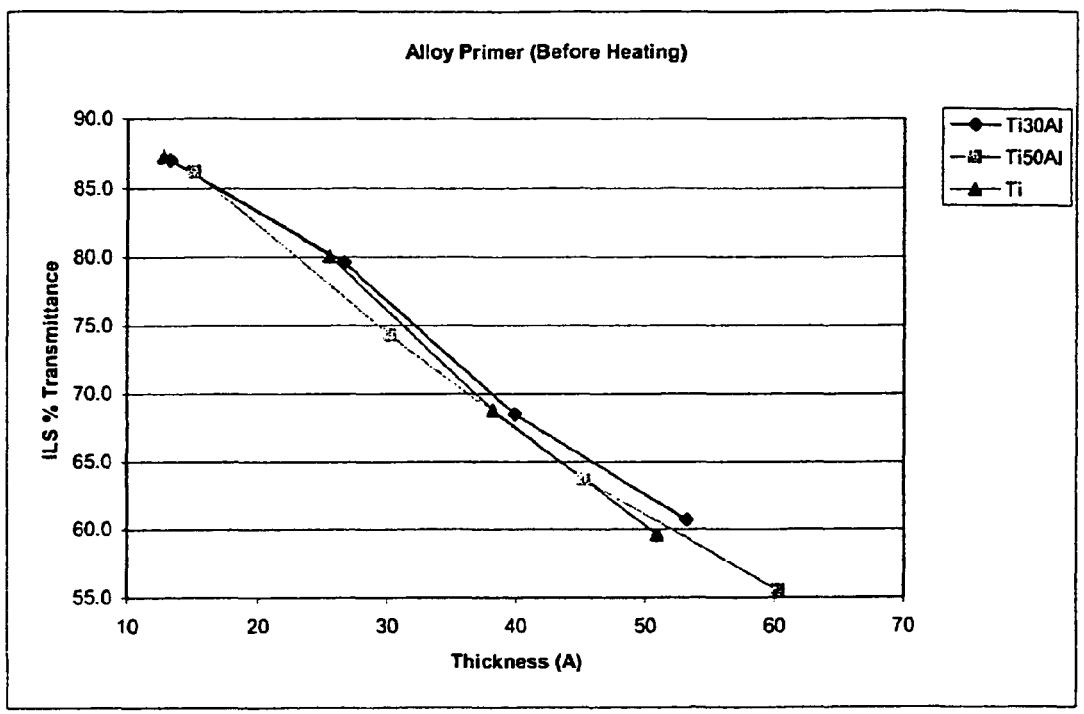
FIGS. 15 and 16 are graphs of transmittance versus thickness for coatings of the invention before and after heating.

FIG. 15 shows the behavior of the transmittance of the coating in the ILS coater with primer thickness of the Ti-30 Al and the Ti-50 Al primers before heating. The Ti primer is shown as a comparison to the alloy primers. The transmittance of the coating decreases with increasing-thickness for the primers. All primers show about the same behavior. This is due to the increasing absorption of the primer layers with increasing thickness.

Figure 16:
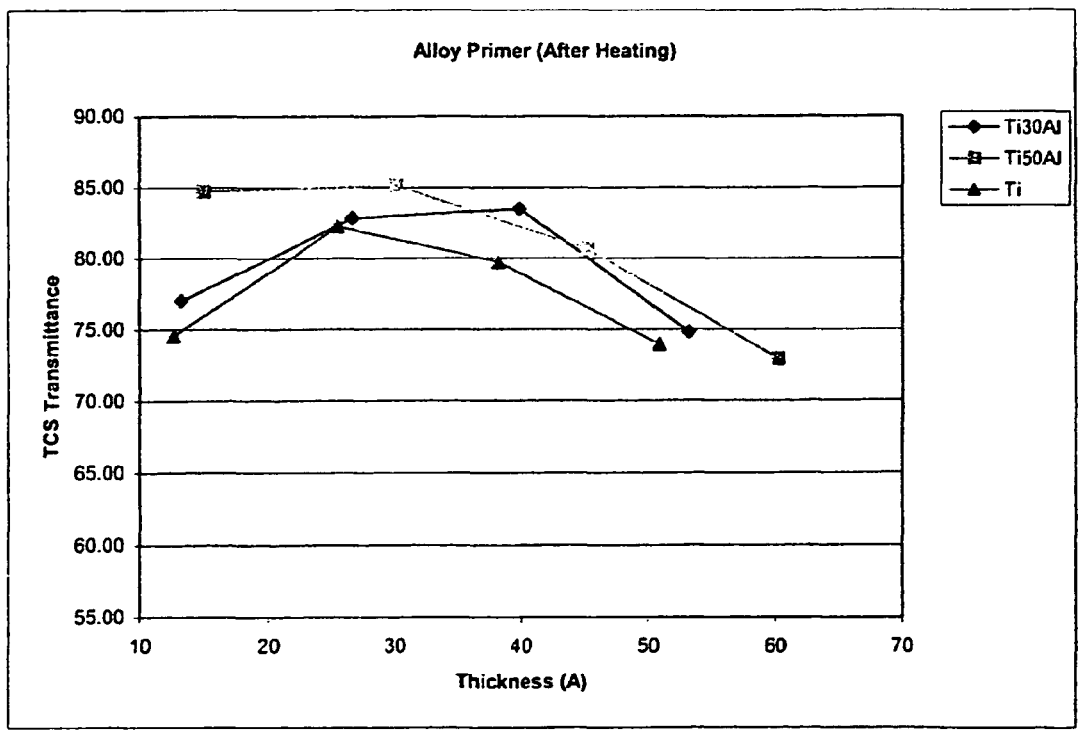

FIG. 16 shows the behavior of the transmittance of the coating, as measured on the TCS spectrophotometer, with primer thickness of the Ti-30 Al and the Ti-50 Al primers after heating. The Ti primer is shown as a comparison to the alloy primers. Surprisingly, the Ti-50 Al primer layer has higher transmittance than the Ti and Ti-30 Al primer layers. There is a range of thin primer layers where the chart indicates a constant high transmittance from 15 to 30 Angstroms. This is highly desirable, particularly when minimum light transmittance requirements impose limitations on coating performance, e.g., the 70% and 75% light transmittance requirements (Illuminant A) for windshields in the U.S. and Europe, respectively.

TABLE G

Ti—Al Primer Layers

| | | ILS Coater Settings | | | | Sheet Resistance (ohms/square) | | % Transmittance | |
| | | | | | | | | ILS | TCS |
| Sample No. | Target material | Power (kilowatts) | Pass | Voltage (volts) | Current (amps) | Thickness (Angstroms) | before heat | after heat | before heat | after heat |
| --- | --- | --- | --- | --- | --- | --- | --- | --- | --- | --- |
| B1 | Ti—30Al | 0.3 | 1 | 354 | 1.32 | 13 | 5.96 | ∞ | 87.0 | 77.04 |
| B2 | Ti—30Al | 0.6 | 1 | 390 | 1.56 | 27 | 7.85 | 9.1 | 79.6 | 82.84 |
| B3 | Ti—30Al | 0.9 | 1 | 410 | 2.20 | 40 | 7.51 | 6.6 | 68.5 | 83.49 |
| B4 | Ti—30Al | 1.2 | 1 | 423 | 2.84 | 53 | 7.66 | 8.4 | 60.7 | 74.83 |
| B5 | Ti—50Al | 0.3 | 1 | 380 | 0.82 | 15 | 6.97 | 13.6 | 86.2 | 84.73 |
| B6 | Ti—50Al | 0.6 | 1 | 426 | 1.42 | 30 | 8.46 | 6.9 | 74.3 | 85.16 |
| B7 | Ti—50Al | 0.9 | 1 | 458 | 1.98 | 45 | 8.2 | 8.9 | 63.7 | 80.65 |
| B8 | Ti—50Al | 1.2 | 1 | 482 | 2.52 | 60 | 8.08 | 13.1 | 55.5 | 72.93 |
| CB1 | Ti | 0.3 | 1 | 317 | 0.96 | 13 | 6.35 | ∞ | 87.3 | 74.55 |
| CB2 | Ti | 0.6 | 1 | 340 | 1.78 | 25 | 7.42 | 7.9 | 80.1 | 82.28 |
| CB3 | Ti | 0.9 | 1 | 354 | 2.56 | 38 | 7.85 | 6.5 | 68.8 | 79.72 |
| CB4 | Ti | 1.2 | 1 | 364 | 3.32 | 51 | 7.78 | 8.2 | 59.6 | 73.96 |

Results—Ti—Al Primer Layers

Figure 13:
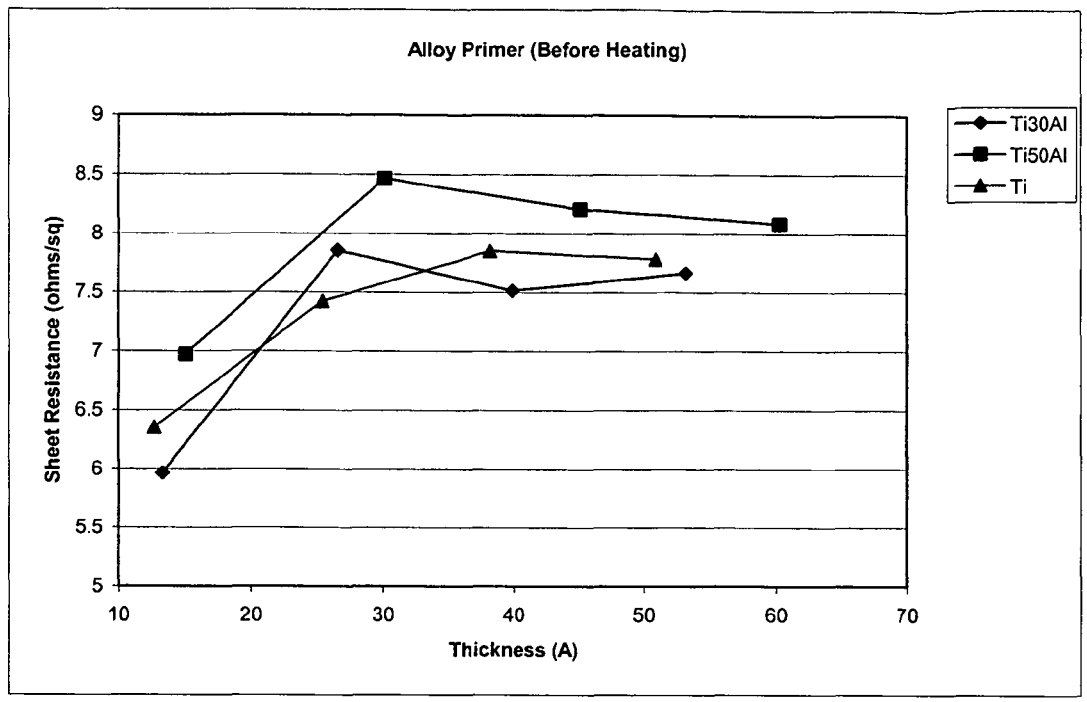
FIGS. 13 and 14 are graphs of sheet resistance versus thickness for coatings of the invention before and after heating.

FIG. 13 shows the behavior of the sheet resistance with primer thickness of the Ti-30 Al and the Ti-50 Al primers before heating. The Ti primer is shown as a comparison to the alloy primers. The primers behave similarly with the Ti-50 Al primer having a slightly higher resistance than the Ti and Ti-30 Al primers.

Figure 14:
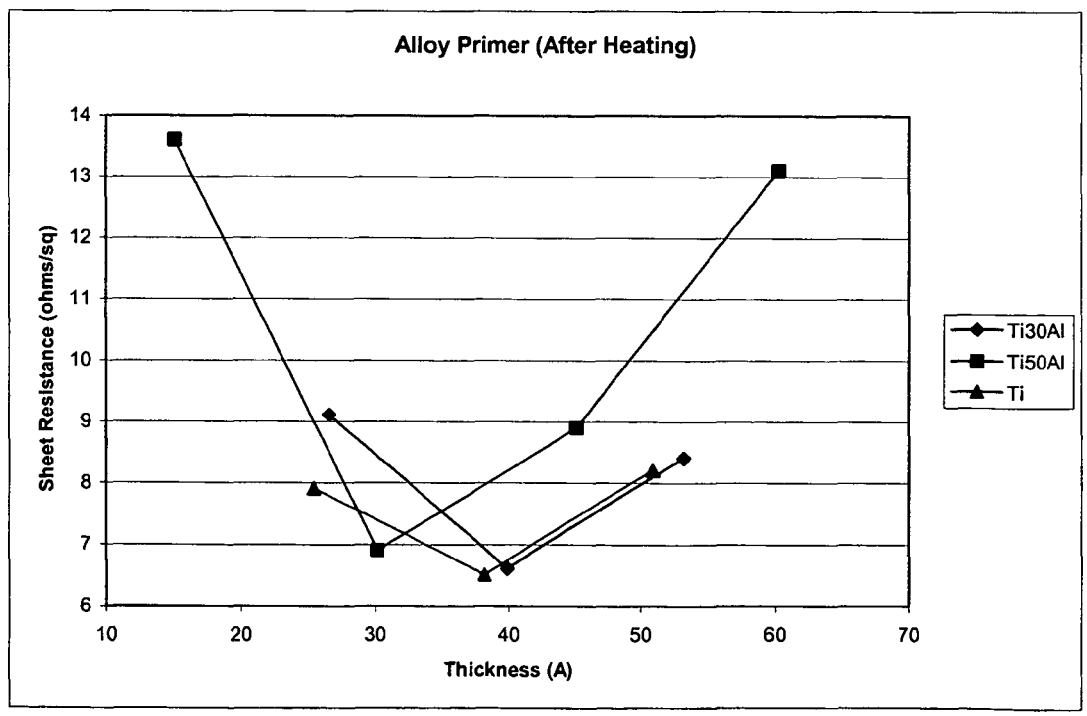

FIG. 14 shows the behavior of the sheet resistance with primer thickness of the Ti-30 Al and the Ti-50 Al primers after heating. The Ti primer is shown as a comparison to the alloy primers. The Ti-50 primer is still electrically conductive with a primer layer less than 20 Angstroms, indicating a continuous silver layer after heating. The Ti and Ti-30 Al primers are not conductive after heating with a primer layer less than 25 Angstroms, and consequently the silver layer is not continu- Example 7

Ti—Al and Ti—Al Oxide Overcoat Layers Sputtered over Low Emissivity Coatings

Low emissivity coatings with the coating the layer sequence:

Glass/zinc stannate/silver/titanium/zinc stannate/Ti—Al oxide or Ti—Al were deposited in an Airco ILS 1600 coater on 12"×12" (30.5 cm×30.5 cm) square, by 2.3 mm thick clear float glass substrates at ambient temperature. The substrate was conveyed at a line speed of the 120 inches per minute (3.05 m per minute). The base pressure was in the low $10^{-6}$ Torr range and the operating pressure was microns (mTorr). The substrate was at ambient temperature during deposition. Planar targets of Ti—Al alloy, where the amount of aluminum is expressed in atomic percent, were used to deposit metal oxide or metal films over the low emissivity coatings, as indicated in the above layer sequence. Ti-30 and Ti-50 Al alloy targets were fabricated by Hot Isostatic Pressing (HIP) powders of the alloy. The Ti-90 Al alloy target was made by Vacuum Induction skull Melting (VIM) and casting an ingot target from the metal powders. Chemical analysis of the alloy was used to determineithe weight percent of the individual metals. The alloy oxide films were deposited in an atmosphere of a mixture of 20% argon and 80% oxygen gas. The alloy films were deposited in 100% argon gas. The coatings with Ti—Al overcoats on the low emissivity were compared with titanium oxide overcoats and no overcoats on the low emissivity coating. The target compositions are shown in Table H below.

4 inch×4 inch (10.2 cm×10.2 cm)×2.3 mm thick samples of coated glass were heated in a Thermolyne Type 30400 Furnace set at 1300° F. (703° C.). The samples were placed on a 3.5 inch×3.5 inch (8.9 cm×8.9 cm) bending iron and placed in the furnace for 240 seconds. The coated glass attains a temperature of 1170° F. (632° C.) in that time as determined by thermocouple measurements of similar low emissivity coatings. Sheet resistance and transmittance of the coating were recorded both before and after the heating in the furnace. The transmittance was read in the ILS coater before heating and on the TCS meter after heating.

TABLE H

Target Composition

Ti—Al Target Composition Analysis

| Ti— at % Al | wt % Al (balance Ti) | Method of Target Fabrication |
|---|---|---|
| Ti—10Al | 5.85 | HIP |
| Ti—30Al | 19.2 | HIP |
| Ti—50Al | 36.48 | HIP |
| Ti—90Al | 16.31 | VIM |
| Ti—75Al | 63.3 | Plasma Spray |

Sample F13

The first layer of an alloy of zinc and tin of 48% tin and 52% zinc by weight was deposited in an atmosphere of 20% argon gas and 80% oxygen gas mixture as set on the flow controller. The power to the cathode target was set at 2.14 kilowatts resulting in a voltage of 385 volts and a current of 5.56 amps. The glass was passed under the cathode 6 times at a conveyor speed of 120 inches per minute (3.05 meters per minute) until the transmission reached 80.3%. The thickness of the first layer was 426 Angstroms. The second layer was deposited using a silver cathode in a 100% argon gas atmosphere. The power to the cathode was set at 0.40 kilowatts, resulting in a voltage of 437 volts and a current of 0.91 amps. The glass was passed under the cathode 1 time, which resulted in a transmission of 65.7%. The thickness of the second layer was 95 Angstroms. The third layer was deposited using a titanium target at a power setting of 0.42 kilowatts, with a voltage of 322 volts and a current of 1.30 amps. The thickness of the titanium primer layer was calculated to be 20 Angstroms after 1 pass the transmission was 51.2%. The fourth layer was deposited under the same conditions as the first layer, resulting in a transmission of 83.5%. The overcoat layer was deposited by passing the glass 3 times under the Ti-90 Al target, in an atmosphere of 20% argon gas and 80% oxygen gas mixture, at a power setting of 3.10 kilowatts, with a voltage of 373 volts and a current of 8.28 amps. The final transmittance of the coating after the deposition of the overcoat layer was 82.1% and after heating was 85.9%. The overcoat thickness is 50 Angstroms. The sheet resistance after coating was 9.07 ohms per square after deposition and 7.88 ohms per square after heating.

Samples F1-F12, F14-F22, FC1-5

The first and fourth layer were deposited from the alloy target of zinc and tin, the second layer was deposited from the silver target, and the third layer was deposited from the titanium target in a similar manner to Sample F13. The silver and ZnSn oxide thicknesses are shown in the Table I: Ti—Al Overcoat Layers on Low Emissivity Coating. The oxide overcoat layer (F1-F14) was deposited by passing the glass with the low emissivity coating under the Ti—Al target or Ti target (FC1), set at a constant power on the power supply, in an atmosphere of 20% argon and 80% oxygen. The metal overcoat layer (F15-F22) was deposited by sputtering in a gas of 100% argon. The voltage and currents for each power setting for the overcoats are shown in Table I. The overcoat thickness, the final transmittance of the coating after the deposition and after heating, and the sheet resistance after deposition and after heating, along with the percent change in sheet resistance are shown in Table I. Samples with no overcoat layer (FC3-5) are indicated by 0 thickness in the Overcoat Layer section of the Table I.

TABLE I

Ti—Al Overcoat Layers over Low Emissivity Coating

| | | | | | | | | Low Emissivity Coating (includes overcoat layer) | | | | | |
|---|---|---|---|---|---|---|---|---|---|---|---|---|---|
| | | Overcoat Layer | | | | | | Percent Transmittance | Sheet Resistance | | | | Thickness (Å) | |
| | | | Passes | Power Supply Readings | | | Thickness | TCS | (ohms/sq) | | | | ZnSn | |
| Sample # | Target Material | Process gas | under target | Kw | Voltage | Current | (Å) | ILS | After Heat | Before Heat | After Heat | % change | Oxide layer | Ag layer |
| FC1 | Ti | Ar—8O$_2$ | 4 | 2.4 | 477 | 5.00 | 32 | 83.0 | 84.27 | 8.27 | 7.94 | −3.99 | 417 | 101 |
| F1 | Ti—10Al | Ar—8O$_2$ | 4 | 2.26 | 491 | 4.60 | 26 | 82.7 | 85.03 | 6.87 | 6.22 | −9.46 | 435 | 110 |
| F2 | Ti—10Al | Ar—8O$_2$ | 4 | 3.77 | 518 | 7.30 | 47 | 82.3 | 82.09 | 8.29 | 8.31 | 0.24 | 439 | 101 |
| F3 | Ti—30Al | Ar—8O$_2$ | 4 | 2.5 | 528 | 4.74 | 26 | 83.3 | 85.59 | 8.24 | 6.69 | −18.81 | 431 | 103 |
| F4 | Ti—30Al | Ar—8O$_2$ | 4 | 3.8 | 565 | 6.72 | 46 | 82.8 | 84.85 | 8.27 | 6.52 | −21.16 | 434 | 104 |
| F5 | Ti—30Al | Ar—8O$_2$ | 4 | 3.8 | 561 | 6.78 | 57 | 82.3 | 83.5 | 8.77 | 7.36 | −16.08 | 449 | 97 |
| F6 | Ti—30Al | Ar—8O$_2$ | 4 | 4 | 575 | 6.69 | 71 | 83.0 | 84.92 | 7.97 | 7.24 | −9.16 | 411 | 101 |

TABLE I-continued

Ti—Al Overcoat Layers over Low Emissivity Coating

| | | | | | | | Low Emissivity Coating (includes overcoat layer) | | | | | | |
|---|---|---|---|---|---|---|---|---|---|---|---|---|---|
| | Overcoat Layer | | | | | | Percent Trans-mittance | | Sheet Resistance | | | Thickness (Å) | |
| | | | Passes | | | | | TCS | (ohms/sq) | | | ZnSn | |
| Sample # | Target Material | Process gas | under target | Kw | Voltage | Current | Thickness (Å) | ILS | After Heat | Before Heat | After Heat | % change | Oxide layer | Ag layer |
| F7 | Ti—30Al | Ar—80O₂ | 6 | 4 | 560 | 7.15 | 75 | 82.0 | 83.95 | 8.75 | 8.87 | 1.37 | 436 | 101 |
| F8 | Ti—50Al | Ar—80O₂ | 4 | 2.2 | 402 | 5.47 | 34 | 82.9 | 86.44 | 7.66 | 6.17 | −19.45 | 418 | 106 |
| F9 | Ti 50 Al | Ar—80O₂ | 4 | 2.9 | 414 | 7.00 | 48 | 82.0 | 86.33 | 7.7 | 6.7 | −12.99 | 353 | 114 |
| F10 | Ti 50 Al | Ar—80O₂ | 5 | 3.5 | 433 | 8.08 | 70 | 81.9 | 86.61 | 7.82 | 7.36 | −5.88 | 304 | 104 |
| F11 | Ti—50Al | Ar—80O₂ | 4 | 3.6 | 436 | 8.26 | 73 | 82.0 | 83.6 | 8.83 | 7.78 | −11.89 | 434 | 95 |
| F12 | Ti—90 Al | Ar—80O₂ | 2 | 2.6 | 381 | 6.81 | 21 | 82.9 | 87.3 | 7.98 | 6.26 | −21.55 | 386 | 103 |
| F13 | Ti—90Al | Ar—80O₂ | 3 | 3.1 | 373 | 8.28 | 50 | 82.1 | 85.9 | 9.07 | 7.88 | −13.12 | 427 | 95 |
| F14 | Ti 90 Al | Ar—80O₂ | 4 | 3.5 | 384 | 9.06 | 70 | 81.5 | 86.51 | 7.25 | 5.78 | −20.28 | 403 | 113 |
| FC2 | Ti | Ar | 1 | 0.65 | 336 | 1.93 | 31 | 47.1 | 82.44 | 7.91 | 7.05 | −10.87 | 424 | 101 |
| F15 | Ti—10Al | Ar | 1 | 0.55 | 336 | 1.60 | 25 | 53.4 | 84.79 | 8.24 | 7.17 | −12.99 | 417 | 101 |
| F16 | Ti—30Al | Ar | 1 | 0.5 | 396 | 1.26 | 23 | 54.7 | 84 | 8.55 | 7.34 | −14.15 | 416 | 94 |
| F17 | Ti—30Al | Ar | 1 | 1.1 | 458 | 2.4 | 54 | 37.0 | 82.42 | 8.79 | 7.94 | −9.67 | 401 | 93 |
| F18 | Ti 50 Al | Ar | 1 | 0.4 | 0.4 | 1.06 | 25 | 49.5 | 86.72 | 7.93 | 6.05 | −23.71 | 285 | 105 |
| F19 | Ti—50Al | Ar | 1 | 0.5 | 396 | 1.26 | 35 | 47.4 | 83.3 | 8.26 | 7.01 | −15.13 | 441 | 100 |
| F20 | Ti—90Al | Ar | 1 | 0.43 | 452 | 1.00 | 28 | 42.0 | 84.72 | 8.08 | 5.83 | −27.85 | 406 | 100 |
| F21 | Ti—90Al | Ar | 1 | 0.6 | 0.6 | 1.22 | 39 | 30.4 | 44.85 | 7.96 | ∞ | — | 405 | 103 |
| F22 | Ti—90Al | Ar | 1 | 0.6 | 486 | 1.23 | 42 | 30.8 | 44.3 | 8.27 | ∞ | — | 433 | 99 |
| FC3 | — | — | 0 | 0 | 0 | 0 | 0 | 83.7 | 84.14 | 7.66 | 7.56 | −1.31 | 445 | 107 |
| FC4 | — | — | 0 | 0 | 0 | 0 | 0 | 83.3 | 85.03 | 8.64 | 8.43 | −2.43 | 410 | 102 |
| FC5 | — | — | 0 | 0 | 0 | 0 | 0 | 83.1 | 85.17 | 7.94 | 7.66 | −3.53 | 431 | 105 |

Figure 17:
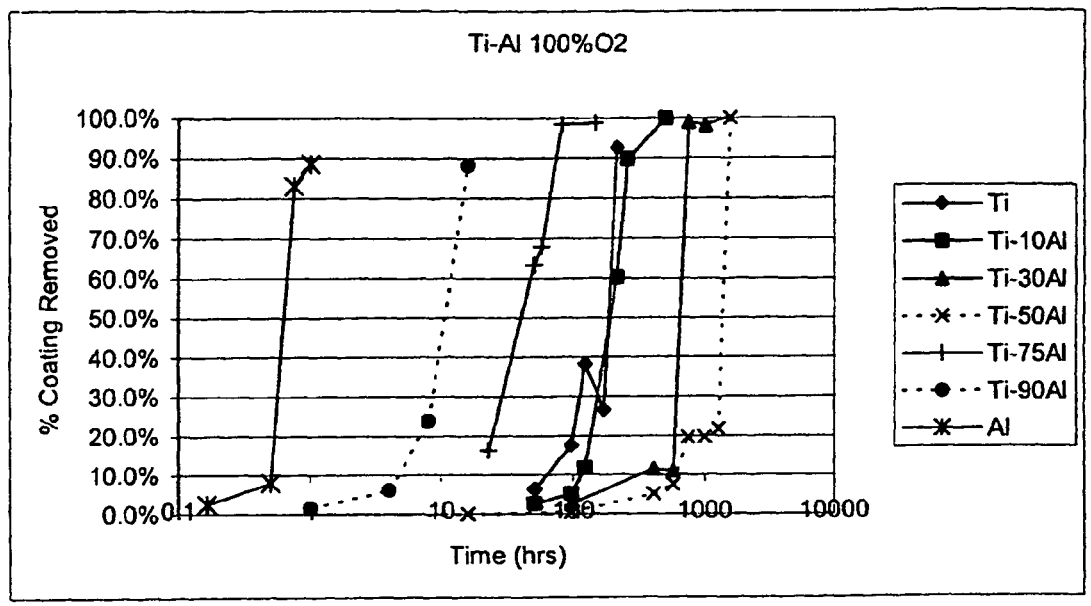
FIG. 17 is a graph of percent coating removed versus time for various coatings of the invention.
Figure 18:
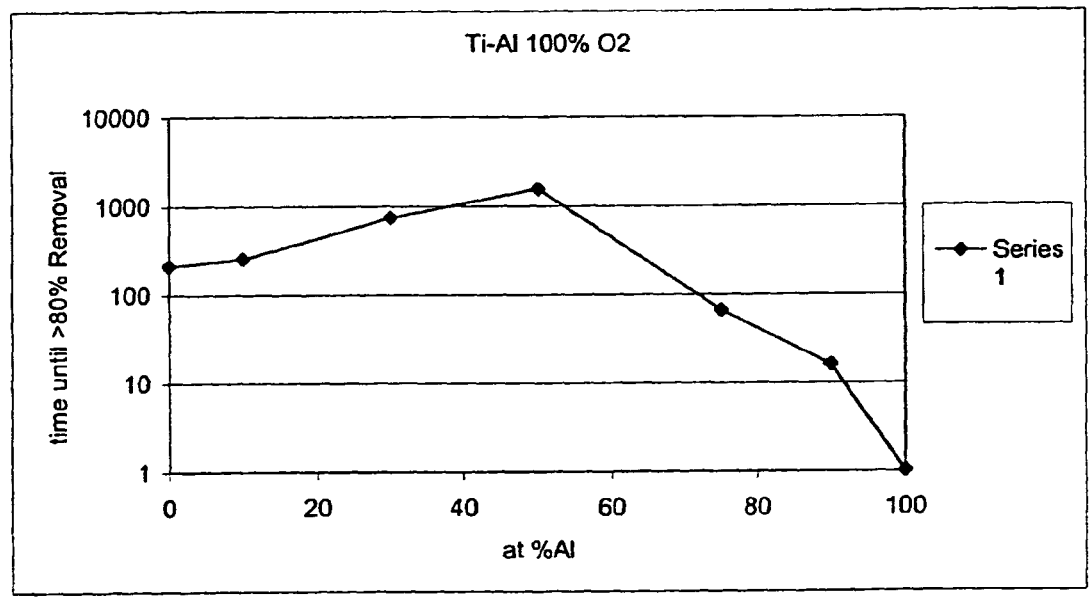
FIG. 18 is a graph of time until 80 percent coating removal versus atomic percent aluminum for a coating of the invention.

Table J shows the deposition parameters for oxides, nitrides, and metal coatings for a target having an alloy composition of titanium with 75 atomic weight aluminum. The results of Table J are shown in FIGS. 17 and 18 discussed below.

TABLE J

| Sample No. | Target Alloy | ILS Coater Settings | | | | | | Measured Thickness (Å) | XRF (ug/cm²) | | Wt % Al |
|---|---|---|---|---|---|---|---|---|---|---|---|
| | | KW | Pass | Volts | Amps | ILS % T | Gas | | Al | Ti | Al |
| J1 | Ti—75Al | 4.0 | 5 | 339 | 11.6 | 88.6 | 80% O2—Ar | 114 | .80 | .58 | 58.0 |
| J2 | Ti—75Al | 4.0 | 30 | 372 | 10.73 | 84.6 | 80% O2—Ar | 663 | 5.26 | 3.88 | 57.5 |
| J3 | Ti—75Al | 3.0 | 3 | 480 | 6.26 | 85.0 | 100% N2 | 173 | 1.66 | 1.16 | 58.9 |
| J4 | Ti—75Al | 3.0 | 20 | 480 | 6.26 | 73.2 | 100% N2 | 898 | 11.60 | 8.32 | 58.2 |
| J5 | Ti—75Al | 3.0 | 1 | 544 | 5.51 | 13.9 | Ar | 202 | 3.34 | 2.37 | 58.5 |
| J6 | Ti—75Al | 3.0 | 5 | 549 | 5.47 | 0.0 | Ar | 1064 | 17.9 | 13.0 | 57.9 |

Example 8

Comparison of Coating Removal Times for Various Ti—Al Coatings

The target compositions of Table H above were applied to a 2.3 mm thick float glass samples and then the removal time of the coating was measured using a conventional Cleveland Condensation Test (CCC) procedure. Multiple sample coupons were cut out of a coated glass sheet. For each sample tested, using the CCC procedure, a neighboring sample (control) was first measured using XRF to determine the number of micrograms per square centimeter of the coating. The samples to be tested were then placed in the CCC device and removed after set periods of time (see FIG. 17). A section of the test sample was then measured using XRF to determine the amount of coating remaining, which was calculated by dividing the measured XRF of the sample versus the XRF of the control.

FIG. 17 shows the percent coating removed versus time for pure titanium and aluminum coatings as well as titanium and aluminum coatings having 10, 30, 50, 75, and 90 atomic percent aluminum. The samples were sputtered in the manner described in Tables C. D, and J. The coating thicknesses are shown in Table K below.

TABLE K

| Sample No. | Target Alloy | ILS Coater Settings | | | | | | Calculated Thickness (Å) | XRF (ug/cm²) | | Wt % Al |
|---|---|---|---|---|---|---|---|---|---|---|---|
| | | KW | Pass | Volts | Amps | ILS % T | Gas | | Al | Ti | Al |
| K1 | Ti | 3.00 | 6 | 541 | 5.54 | 33.8 | 100% N2 | 253 | 0.00 | 7.98 | 0.0% |
| K2 | Ti10Al | 2.83 | 6 | 577 | 4.90 | 37.8 | 100% N2 | 245 | 0.40 | 7.24 | 5.24% |
| K3 | Ti—30Al | 2.61 | 5 | 646 | 4.03 | 46.4 | 100% N2 | 223 | 1.06 | 5.13 | 17.1% |
| K4 | Ti—50Al | 2.84 | 4 | 560 | 5.06 | 59.2 | 100% N2 | 196 | 1.65 | 3.38 | 32.8% |
| K5 | Ti—75Al | 3.00 | 6 | 499 | 6.01 | 76.7 | 100% N2 | 197 | 2.54 | 1.78 | 58.8% |
| K6 | Ti—90Al | 3.05 | 5 | 380 | 7.90 | 83.8 | 100% N2 | 238 | 3.69 | 0.71 | 83.9% |
| K7 | Al | 2.74 | 5 | 351 | 7.82 | 87.3 | 100% N2 | 186 | 3.39 | 0.00 | 100% |
| K8 | Ti | 2.96 | 28 | 494 | 5.99 | 77.6 | 80% O2—Ar | 286 | 0.00 | 5.71 | 0.0% |
| K9 | Ti10Al | 2.96 | 25 | 500 | 5.89 | 81.8 | 80% O2—Ar | 279 | 0.22 | 5.05 | 4.17% |
| K10 | Ti—30Al | 2.93 | 28 | 454 | 6.45 | 83.5 | 80% O2—Ar | 318 | 0.85 | 4.89 | 14.8% |
| K11 | Al 50Ti | 2.95 | 20 | 428 | 6.90 | 87.5 | 80% O2—Ar | 238 | 1.07 | 2.63 | 28.9% |
| K12 | Ti—75Al | 3.00 | 16 | 354 | 8.48 | 88.1 | 80% O2—Ar | 210 | 1.69 | 1.26 | 57.3% |
| K13 | Ti 90Al | 2.88 | 17 | 322 | 8.89 | 88.9 | 80% O2—Ar | 270 | 2.57 | 0.66 | 79.6% |
| K14 | Al | 2.94 | 24 | 305 | 9.63 | 88.9 | 80% O2—Ar | 288 | 3.13 | 0.00 | 100% |

Generally, titanium coatings survive longer than aluminum coatings in a Cleveland Condensation Test. Therefore, one would anticipate that adding aluminum to a titanium coating would degrade the titanium coating. However, surprisingly, it was discovered that at a ratio of about 50 atomic percent aluminum, the titanium and aluminum coating showed surprisingly better results (i.e., it took longer to remove the coating).

FIG. 18 shows the time until about 80% of the coating was removed versus the atomic percent aluminum in the coating. The left of the graph represents pure titanium and the right of the graph represents pure aluminum. One would anticipate adding aluminum to titanium would severely degrade the ability of the coating to resist mechanical and/or chemical attack. However, FIG. 18 surprisingly shows that rather than degrading the titanium, the presence of aluminum in the range of about 10 to 75 atomic percent actually improves the coating performance, i.e., it takes longer to remove the coating. It would appear that this effect is most pronounced in the range of about 40 to 60 atomic percent aluminum, with a peak at about 50 atomic percent aluminum.

Figure 19:
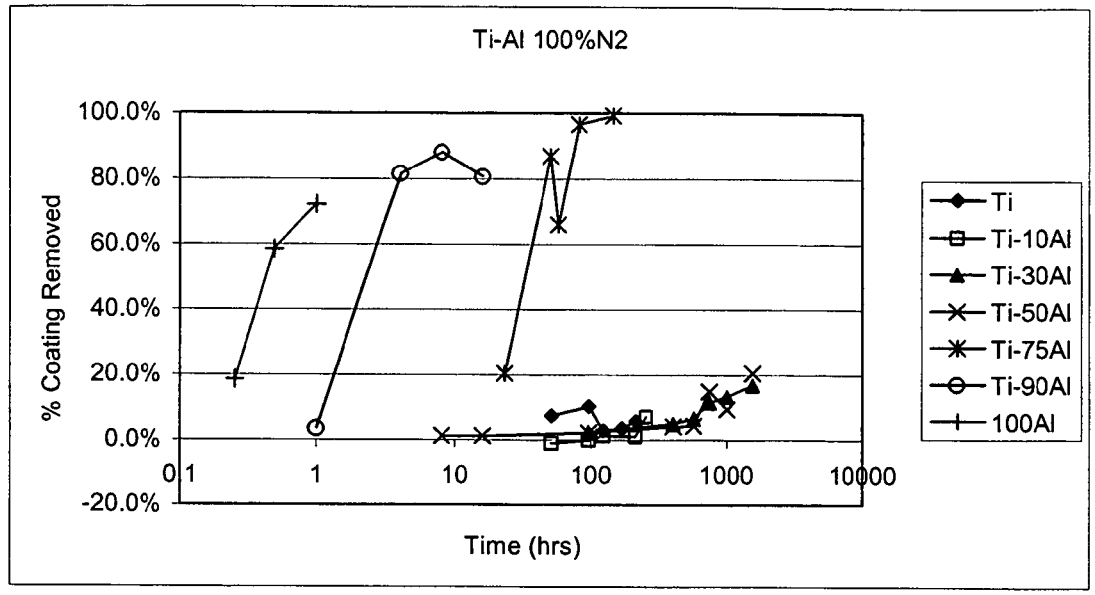
FIG. 19 is a graph of percent coating removed versus time for various coatings of the invention.

FIG. 19 is similar to FIG. 17 but shows the results for the nitride coatings of Table K. Again, a titanium and aluminum nitride coating with 50 atomic percent aluminum shows surprisingly unexpected results.

Figure 20:
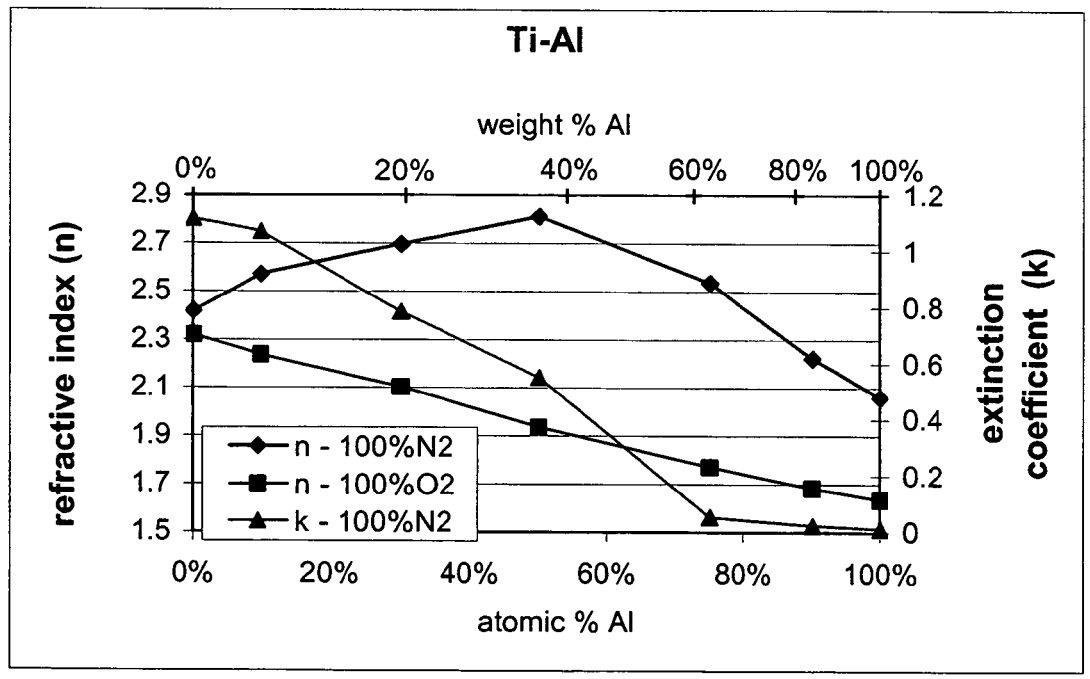
FIG. 20 is a graph of refractive index and extinction coefficient versus atomic percent aluminum and weight percent aluminum for coatings of the invention.

FIG. 20 shows the reactive index (n) and extinction coefficient (k) for titanium and aluminum-containing coatings deposited in atmospheres of pure nitrogen or 80% oxygen with the balance argon. From FIG. 20, an oxide coating of titanium and aluminum provides a lower refractive index than a nitride coating in the range of about 0 to 60 atomic percent aluminum. Also, the use of titanium and aluminum-containing coatings, e.g., oxides, oxynitrides, nitrides, or metals, in a coating stack provide a layer that can provide a range of indices of refraction and/or extinction coefficients. By varying the extinction coefficient, one can vary absorption in the coating. The coating of the invention provides a range of refractive indices. As shown in FIG. 19, above 75 atomic percent Al there is little or no absorption for titanium nitride and this material has a high refractive index. At 50 atomic percent Al, there is a mid-range extinction coefficient and a high index of refraction. One can envision using combinations of the titanium and aluminum material of the invention as oxides, nitrides, oxynitrides, or metals to produce a wide variety of high index and low index materials. A lower index of refraction permits a thicker optical layer and at the same time provides enhanced corrosion resistance. One can provide a better index match to vinyl materials, such as PVB. Higher absorption layers provide lower transmittance with functionality, e.g., a lower shading coefficient. The higher absorbing materials contain amounts of titanium nitride, which are shown in the corrosion data above to be very durable. Such coatings could be used as first or second surface coatings on window, automotive, or decorative glazings, just to name a few.

The above examples illustrate the present invention which relates to using titanium and aluminum-silicon, titanium and aluminum-silicon-transition metal and titanium and aluminum-transition metal cathode targets sputtered in pure nitrogen, in nitrogen-oxygen mixtures ranging up to 40 percent oxygen, and in argon-oxygen mixtures comprising up to 50 percent oxygen. Based on the data illustrated in the figures, a single titanium and aluminum-alloy cathode target containing a given weight percentage of silicon, silicon-transition metal or transition metal can be used for stable sputtering of a range of film compositions including oxides, nitrides and oxynitrides with varying absorption at high sputtering rates.

It should be appreciated that all of the protective coatings discussed above can be used within a low emissivity coating, such as but not limited to those discussed earlier and illustrated in FIG. 1. More particularly, the Ti—Al and Ti—Al—Si oxides, nitrides and oxynitrides and combinations thereof, can be used as dielectric layers like the layers of ZnSn Oxide or Zn Oxide (layers 44, 50 and 56), and the protective overcoat in FIG. 1 (layer 16).

It should also be appreciated that the Ti—Al and Ti—Al—Si metal or alloy coatings can be used as primer layers as shown in FIG. 1 (layers 54 and 48) over the silver layers. The coatings of Ti—Al and Ti—Al—Si metal or alloy coatings can also be used as the protective overcoat layer as described above and shown in FIG. 1 (layer 16). The metal or alloy coating can be subsequently oxidized to form a metal or alloy oxide coating during high temperature processing of glass, such as tempering or bending.

It should be further appreciated that all of the above protective coatings as described above, when incorporated in or over a low emissivity coating, e.g., as described above and shown in FIG. 1, can be processed at high temperatures, such as tempering and bending of clear float glass.

Example 9

Modifying the Coating Composition Versus Coating Depth for a Sputter Deposited Coating Cathode targets produced by casting and hot isostatic pressing (HIP) of pre-alloyed powder of TiAl were evaluated in this Example. Coating compositions were determined using Secondary Neutral Mass Spectrometry (SNMS) depth profiling, and X-ray fluorescence (XRF) analysis. Coating thicknesses were measured using a stylus profilometer.

The HIP target was fabricated by loading the pre-alloyed powder into a metal container that was subsequently evacuated and sealed. The container was then placed into a high-pressure vessel under 15,000 psi of argon at 1090° C. This step bonds the particles together by diffusion, leaving a fully dense solid uniform composition.

The cast target was fabricated by induction skull melting the raw metals (titanium and aluminum), and pouring the melt into a graphite mold for casting. The casting dimensions were approximately 5.5" [13.75 cm] (the width of the targets), 10" [25.4 cm] height (the length of the targets), and 3.25" [8.125 cm] to accommodate the thickness of the 6 half-targets cut from the casting.

An ILS 1600 Alrco (Vacuum Coating Technologies, Inc.) coater, installed with planar DC magnetron cathodes, and connected to an Advanced Energy Pinnacle® 10 kW power supply was used to deposit the coatings in this Example. The power supply was run in the constant power mode. To simplify analysis by avoiding the complications due to reactive sputtering, the target was sputtered in the metal mode, rather than the reactive mode, in an argon gas atmosphere.

The targets were fixed to a 50-inch×17-inch (125 cm×42.5 cm) copper backing plate and mounted on a water-cooled cathode block. It was necessary to distribute the targets among three cathode blocks; therefore, the samples were run over the period of several pumpdowns. The deposition took place at ambient temperature. The base pressure of the coater before deposition was less than $10^{-6}$ torr (0.13 mPa). Targets were conditioned by pre-sputtering for 15 minutes at 1.0 W, in ultra high purity (99.999%) argon, with a flow rate of 100 sccm, and a pressure of 4 mtorr (0.53 Pa) before deposition. This insured removal of surface oxides and contaminants, and steady state deposition of the alloy. The cathode voltages range from 400 to 450 volts at 1.0 kW, just prior to deposition. A 2.3 mm thick clear float glass substrate was then transported into the vacuum chamber and coated by passing the substrate under the target at a line speed of 120 inches per minute.

FIG. 21 shows the thickness of the coating (normalized to the maximum thickness), and FIG. 22 shows the Al concentration normalized to 50 atomic % Al. This was done by dividing the wt. % of Al by 36.0 wt. % Al (50 atomic % Al). The coatings were deposited from the HIP target and the cast target on stationary substrates.

The normalized thickness for both the cast and HIP targets had a Gaussian-like profile. However, there was a greater concentration of Al sputtered normal to the surface of the target, followed by a sharp drop-off moving away from the center (between about 7 cm and 27 cm). The concentration of Al increased, approaching one edge of the plate, as seen at about 2 cm. The two peaks near the center (about 13 cm and 20 cm) indicate the concentration of Al deposited below the two racetracks of the cathode. The graphs indicate that the cast and HIP targets have similar behavior in the variation in composition; the offset in compositions is due to the higher amount of Al in the cast target (cast target was 39.1 wt. % Al while HIP target was 36.2 wt. % Al).

A SNMS depth profile of a TiAl coating run at 3 kW is shown in FIG. 23. The substrate was passed under the target 10 times at a line speed of 120 inches/min.

The intensity was normalized to the maximum intensity and the data was smoothed using a moving averages trendline set at a period of 2. The total thickness of the coating was 1640 Å, as calculated from the density. The x-axis in FIG. 23 shows the sputter time in seconds for the depth profiling, which is proportional to the thickness. To illustrate the periodicity, the gridlines along the x-axis were placed at time intervals equal to the time to sputter etch 164 Å. The SNMS profile clearly shows the cyclical variation in composition for each pass of the substrate under the target, which is consistent with the non-uniform concentration profile seen with the stationary substrate.

The variation in coating thickness and composition as a function of angle from the target surface was determined by sputtering on a stationary substrate. The coating thickness had Gaussian-like profile. The profiles for both the cast and HIP targets matched. This would indicate that there is no difference in the uniformity of the coating sputtered from the HIP or cast targets. The concentration of Al and Ti in the coating varied as a function of angle, with a higher concentration of the lighter mass element, Al, deposited normal to the direction of the target surface, and with a sharp drop-off in concentration at more oblique angles. The converse behavior was true for the Ti concentration. Depth analysis measurements using SNMS verified this variation.

Surprisingly, as shown in FIG. 23, there is a difference in coating composition versus depth from sputtering a titanium and aluminum coating from a Ti and Al containing cathode target having a fixed or predefined ratio of Al to Ti. FIG. 22 illustrates the difference in aluminum concentration with depth on a coating sputtered onto a stationary substrate. Thus, as can be appreciated from FIGS. 22 and 23, a multilayer coating having differing concentrations of Al or Ti versus depth could be made using a single composition cathode (i.e., a cathode having a fixed ratio of Ti to Al). This would be particularly advantageous in the field of filters. In the past, it was necessary to evaporate two separate sources of coating materials and combine those sources to form the coating. However, this evaporation coating process is difficult to maintain over extended periods of time. For utilizing magnetron sputtering to form a coating with a compositional profile, two or more cathodes were typically required, each being of a differing composition. However, this also increases the complexity of the equipment and the coating process.

Heretofore, it would have been expected that a cathode containing a predefined ratio of a first component and a second component (e.g., aluminum and titanium) would deposit a coating having a uniform titanium and aluminum concentration. However, as shown particularly from FIGS. 22 and 23, it is possible utilizing a single cathode to form a coating having a differing composition versus depth, for example by adjusting or controlling the deposition parameters. For example, the concentration can be varied by controlling the spatial position of the substrate with respect to the cathode, such as by controlling or varying the reciprocating motion of the substrate through the coater. Alternatively, the sputtering gas (e.g., argon, nitrogen, oxygen, helium, xenon, krypton, or mixtures thereof) and/or the gas pressure could be changed to offset the angular distribution of coating concentration.

Alternatively, recognizing this difference in concentration at different positions on the substrate, a coating having a uniform composition versus depth could be formed by compensating for this difference in coating uniformity. This would be particularly advantageous for products where a substantially uniform coating composition is desirable, such as waveguides. For example, the rate of movement of the substrate through the coater can be varied to compensate for the difference in coating composition at differing angles. Alternatively, strips or regions of different composition (e.g., regions of differing concentrations of the first and second components) could be formed on the cathode target to compensate for the difference in concentration versus position on the substrate. Thus, the speed of the substrate could be decreased at higher coating angles to compensate for the decrease in concentration.

While the above Example related specifically to a Ti and Al containing cathode, it is believed similar phenomena would occur in the sputtering of other materials of differing atomic weight.

It will be readily appreciated by those skilled in the art that modifications may be made to the invention without departing from the concepts disclosed in the foregoing description. Accordingly, the particular embodiments described in detail herein are illustrative only and are not limiting to the scope of the invention, which is to be given the full breadth of the appended claims and any and all equivalents thereof.

What is claimed is:

1. A method for depositing a transparent, multilayer, low emissivity coating, comprising:
   maintaining a transparent glass substrate in a chamber, wherein the substrate is larger than at least one square foot; and
   forming a transparent, low emissivity coating stack over at least a portion of the substrate, wherein the coating stack comprises at least one dielectric layer, at least one infrared reflecting metal layer, and at least one sacrificial primer layer, wherein the at least one infrared reflecting metal layer is located between the at least one dielectric layer and the substrate, wherein the at least one dielectric layer is selected from the group consisting of oxides, nitrides, and oxynitrides; wherein the at least one sacrificial primer layer is located between the at least one infrared reflecting metal layer and the at least one dielectric layer;
   wherein the at least one sacrificial primer layer has a varying composition versus depth, and is formed by:
      sputtering at least one cathode having a predefined mixture of aluminum to titanium, said cathode containing from 40 to 60 weight percent of aluminum; and
      reciprocally moving the substrate with respect to the cathode.

2. The method according to claim 1, including passing the substrate under the cathode and varying the speed of the substrate during coating.

3. The method according to claim 1 further comprising a second sacrificial primer layer between the at least one infrared reflecting metal layer and the substrate.

4. The method of claim 1, wherein said cathode contains about 50 weight percent of aluminum, and at least one of the dielectric layer, the primer layer, and the outer protective layer includes aluminum and titanium, with about 50 atomic percent of aluminum being present.

5. The method according to claim 1 further comprises varying the gas pressure during formation of the primer layer.

* * * * *